(12) United States Patent
Lu et al.

(10) Patent No.: US 11,929,288 B2
(45) Date of Patent: *Mar. 12, 2024

(54) GATE-ALL-AROUND DEVICE WITH DIFFERENT CHANNEL SEMICONDUCTOR MATERIALS AND METHOD OF FORMING THE SAME

(71) Applicant: Taiwan Semiconductor Manufacturing Co., Ltd., Hsin-Chu (TW)

(72) Inventors: Jhe-Ching Lu, Tainan (TW); Bao-Ru Young, Hsinchu County (TW); Yen-Sen Wang, Hsinchu County (TW); Tsung-Chieh Tsai, Hsin-Chu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/991,153

(22) Filed: Nov. 21, 2022

(65) Prior Publication Data
US 2023/0078700 A1 Mar. 16, 2023

Related U.S. Application Data

(63) Continuation of application No. 16/938,401, filed on Jul. 24, 2020, now Pat. No. 11,508,624.
(Continued)

(51) Int. Cl.
*H01L 21/8238* (2006.01)
*H01L 27/092* (2006.01)

(52) U.S. Cl.
CPC ............ *H01L 21/823807* (2013.01); *H01L 21/823814* (2013.01); *H01L 21/823821* (2013.01); *H01L 21/823878* (2013.01); *H01L 27/0924* (2013.01)

(58) Field of Classification Search
CPC ..... H01L 21/823807; H01L 21/823814; H01L 21/823821; H01L 21/823878;
(Continued)

(56) References Cited

U.S. PATENT DOCUMENTS 8,772,109 B2  7/2014 Colinge
8,785,285 B2  7/2014 Tsai et al.
(Continued)

Primary Examiner — Karen Kusumakar
Assistant Examiner — Adam S Bown
(74) Attorney, Agent, or Firm — HAYNES AND BOONE, LLP

(57) ABSTRACT

Semiconductor device and the manufacturing method thereof are disclosed. An exemplary method comprises forming a first semiconductor layer including a first semiconductor material in a first area of a substrate; alternately depositing second semiconductor layers and third semiconductor layers over the first semiconductor layer and over the substrate to form a semiconductor layer stack, wherein the second semiconductor layers include a second semiconductor material, the third semiconductor layers include the first semiconductor material, the second semiconductor material is different from the first semiconductor material, and a bottom surface of one of the second semiconductor layers contacts the first semiconductor layer in the first area and contacts the substrate in a second area of the substrate; planarizing a top surface of the semiconductor layer stack; and patterning the semiconductor layer stack to form a first semiconductor structure in the first area and a second semiconductor structure in the second area.

20 Claims, 39 Drawing Sheets

Related U.S. Application Data

(60) Provisional application No. 62/906,188, filed on Sep. 26, 2019.

(58) Field of Classification Search
CPC ............... H01L 27/0924; H01L 27/092; H01L 29/0673; H01L 29/42392; H01L 29/66439; H01L 29/775; H01L 29/78696; B82Y 10/00
See application file for complete search history.

(56) References Cited

U.S. PATENT DOCUMENTS

| | | |
|---|---|---|
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |
| 9,576,814 B2 | 2/2017 | Wu et al. |
| 2019/0221638 A1* | 7/2019 | Reznicek .......... H01L 29/66439 |
| 2019/0355723 A1* | 11/2019 | Miao ................. H01L 29/78684 |
| 2021/0098310 A1 | 4/2021 | Lu et al. |

\* cited by examiner

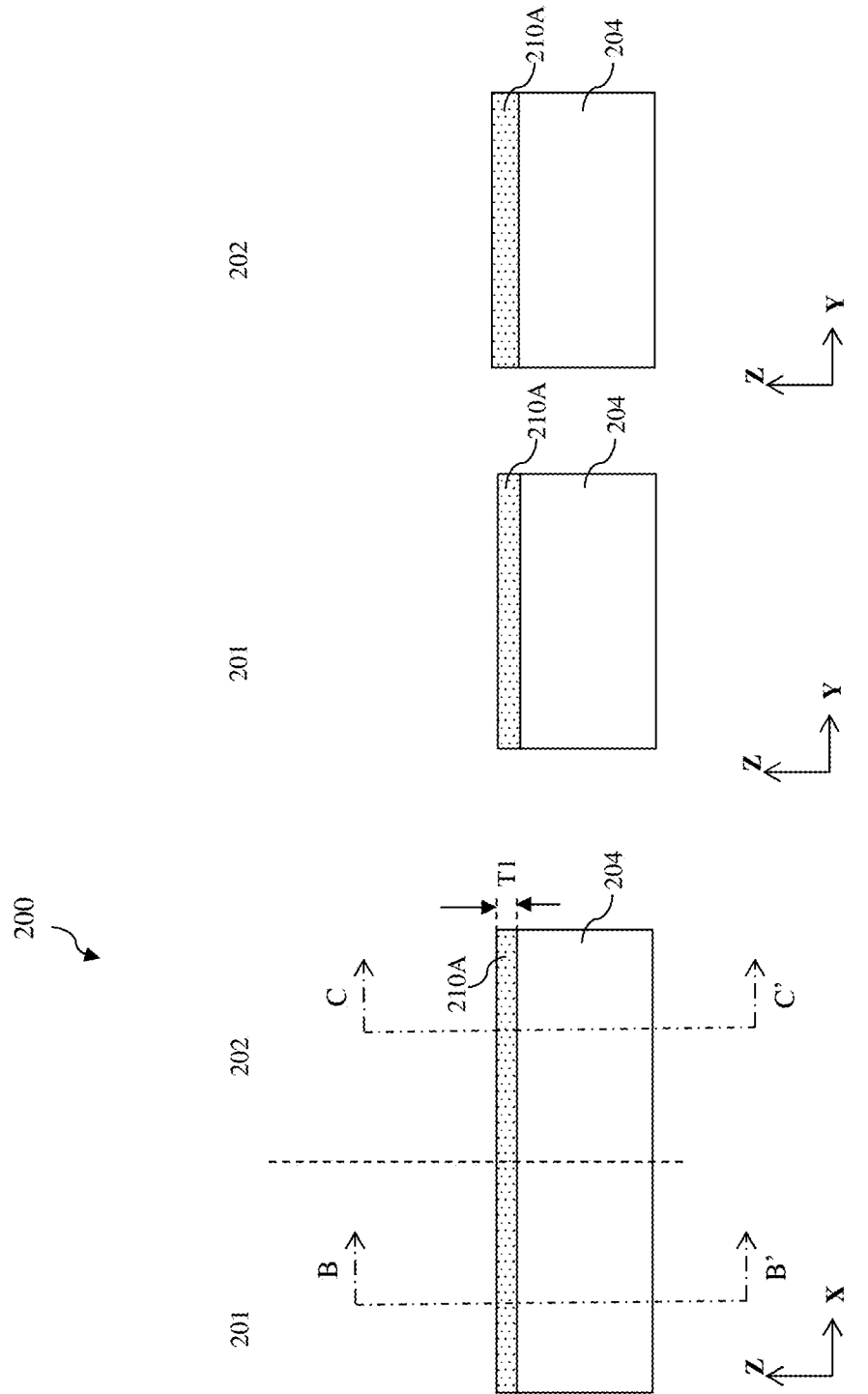

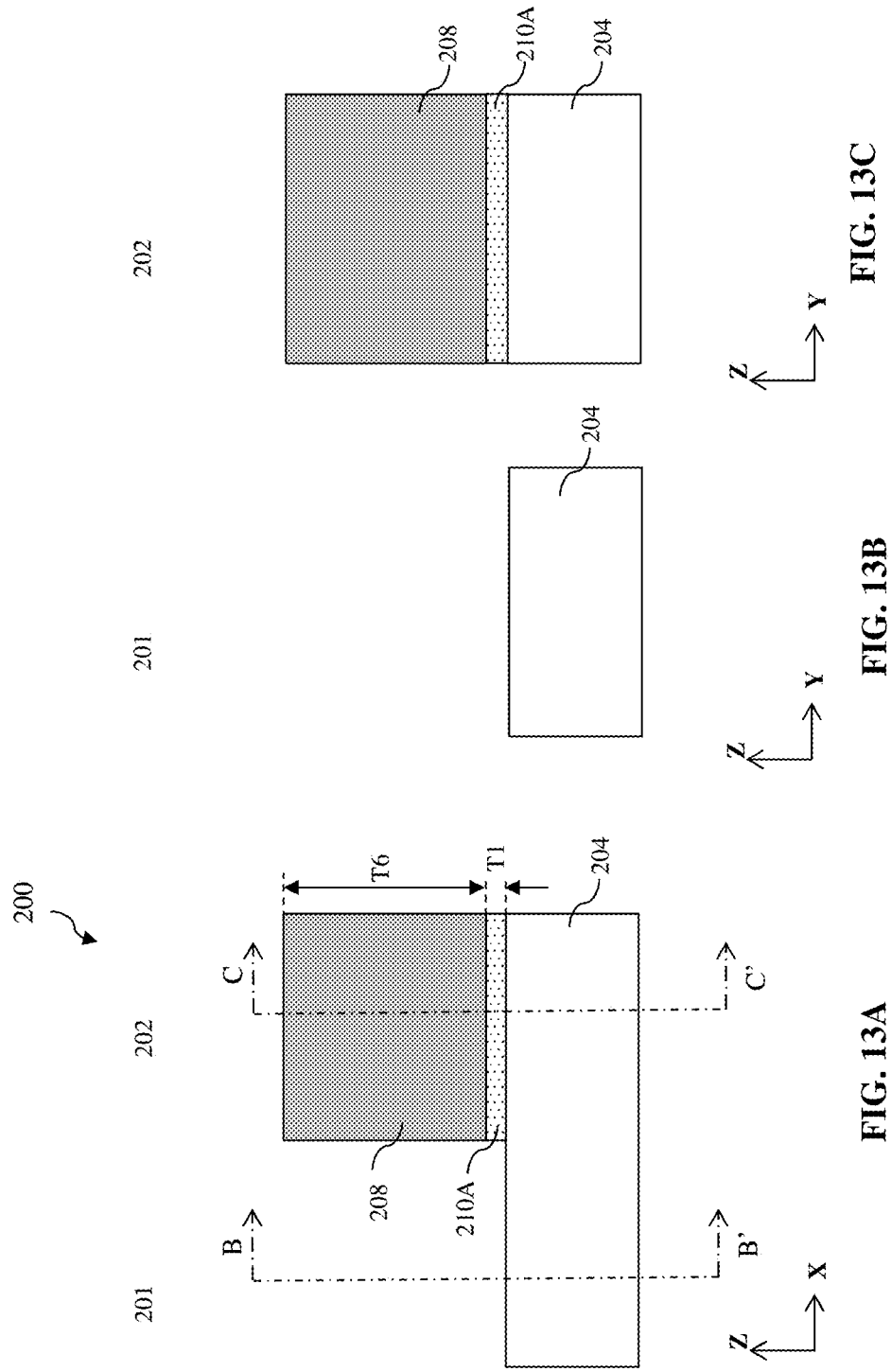

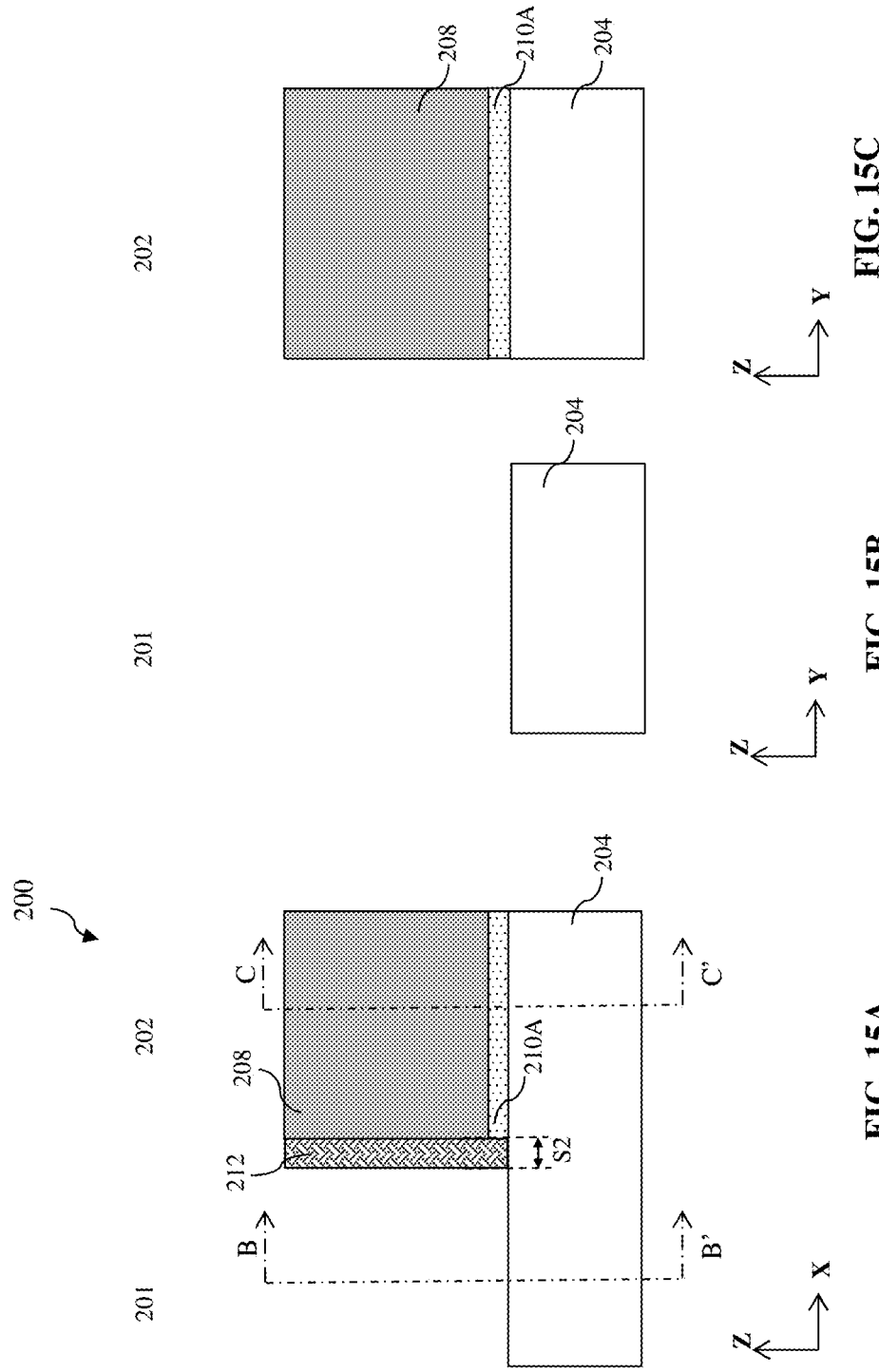

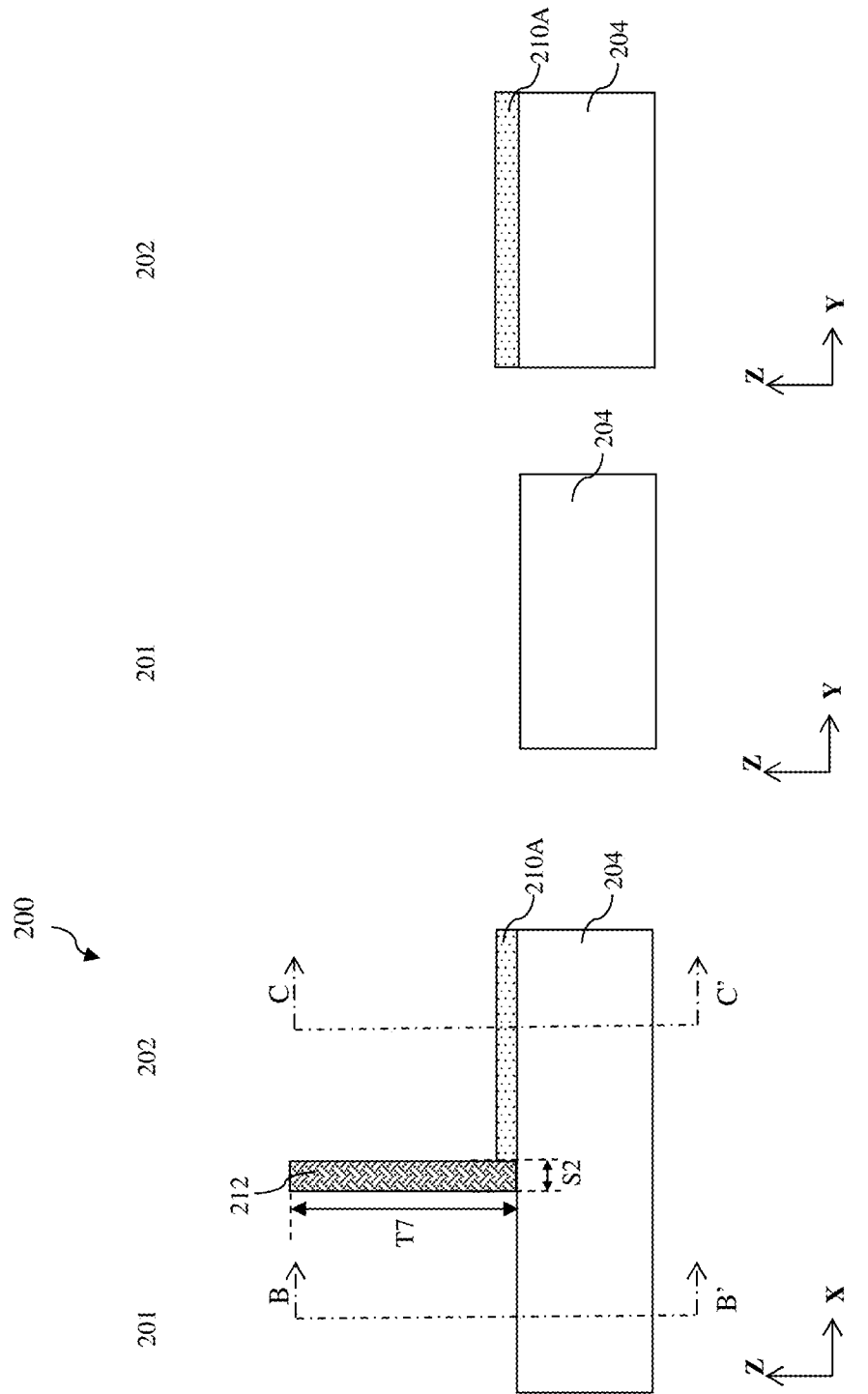

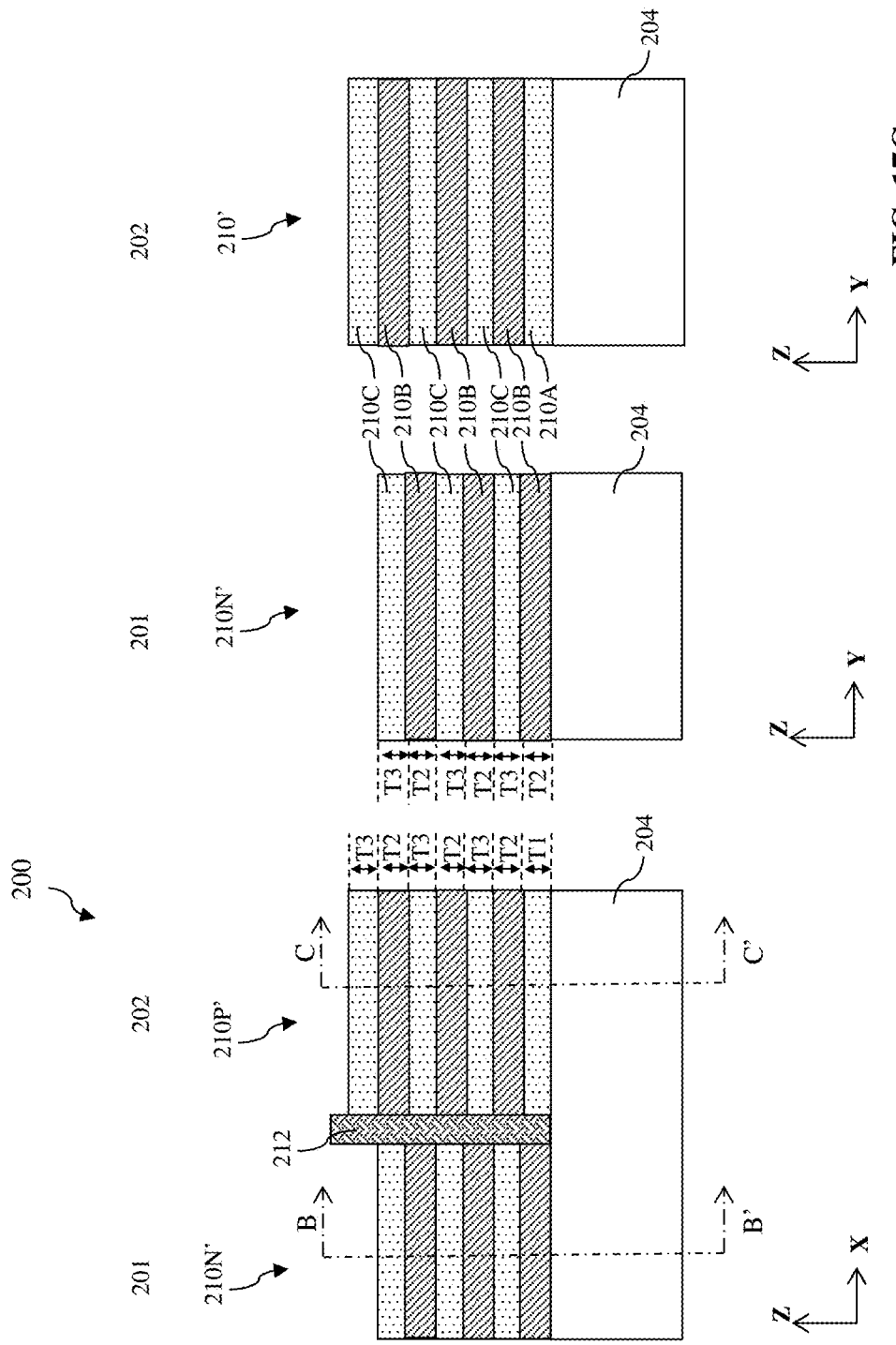

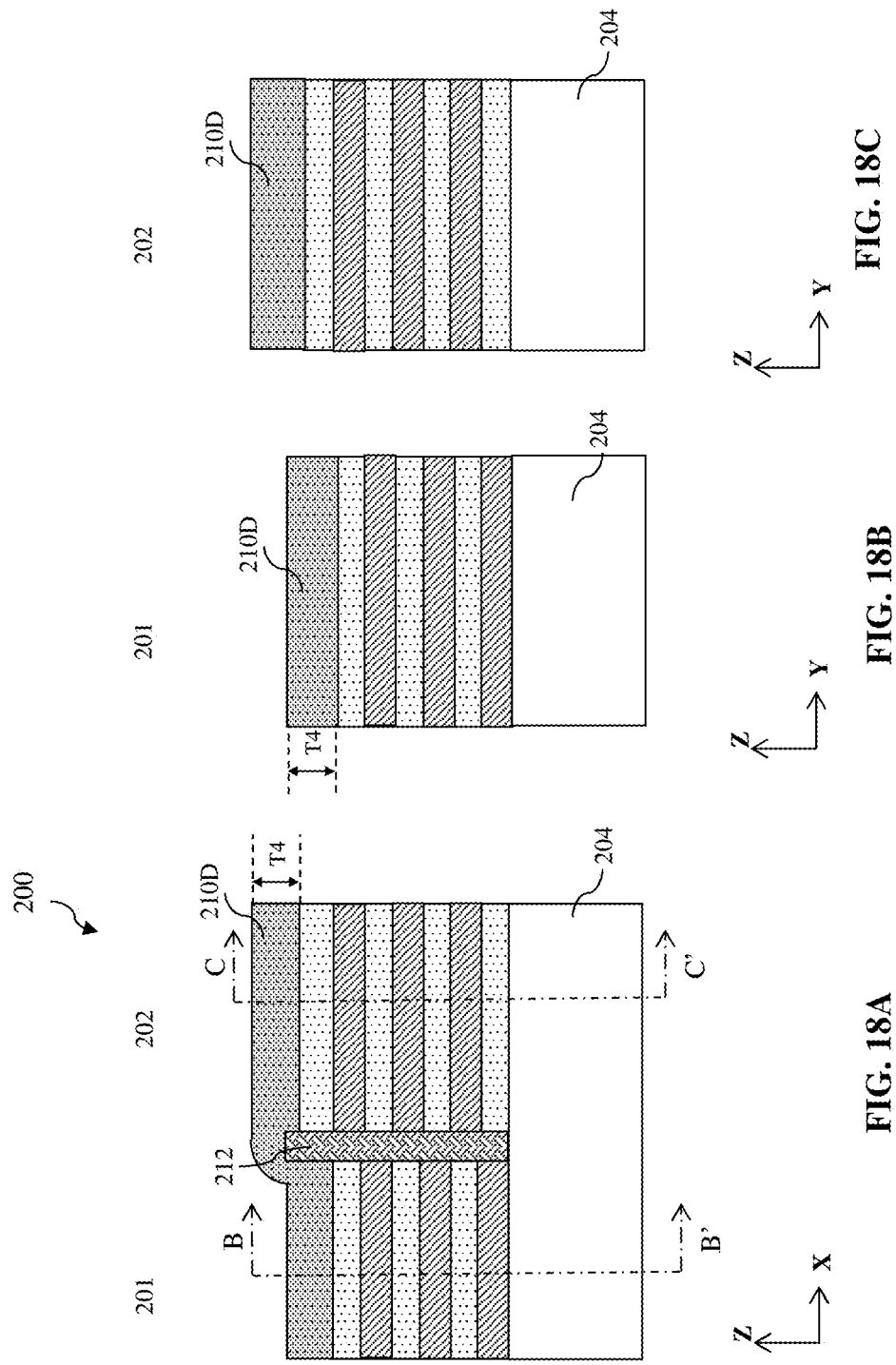

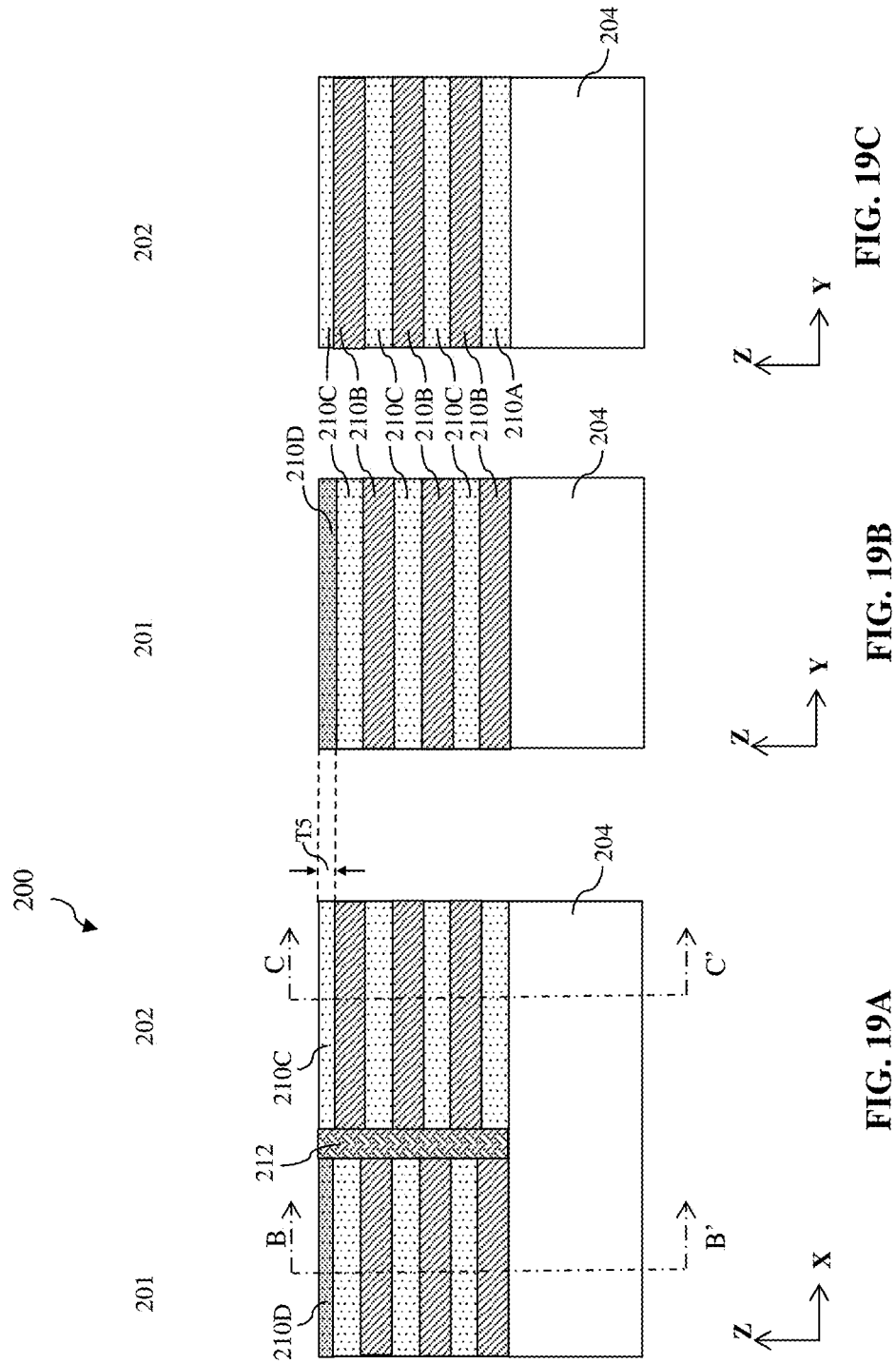

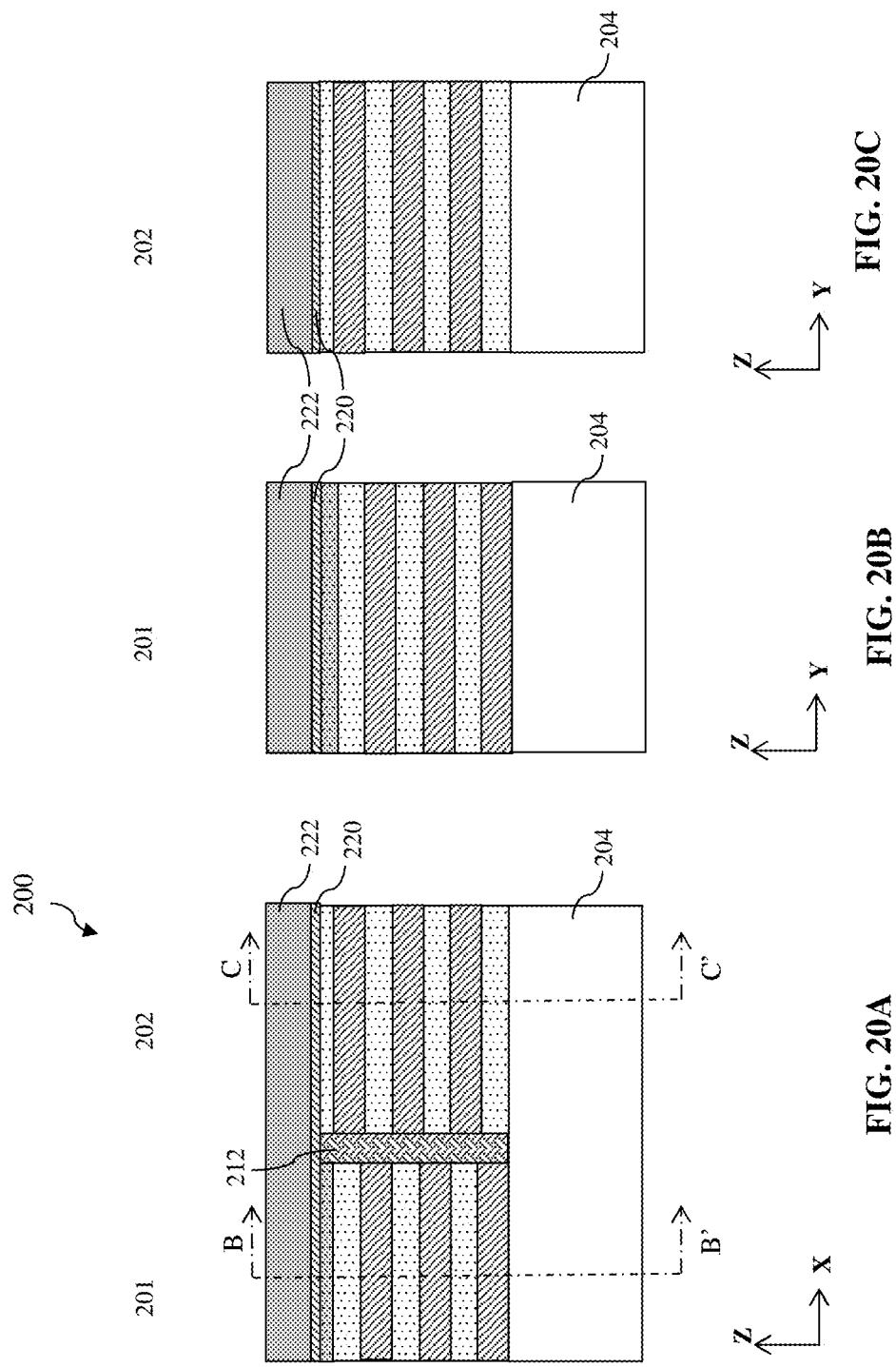

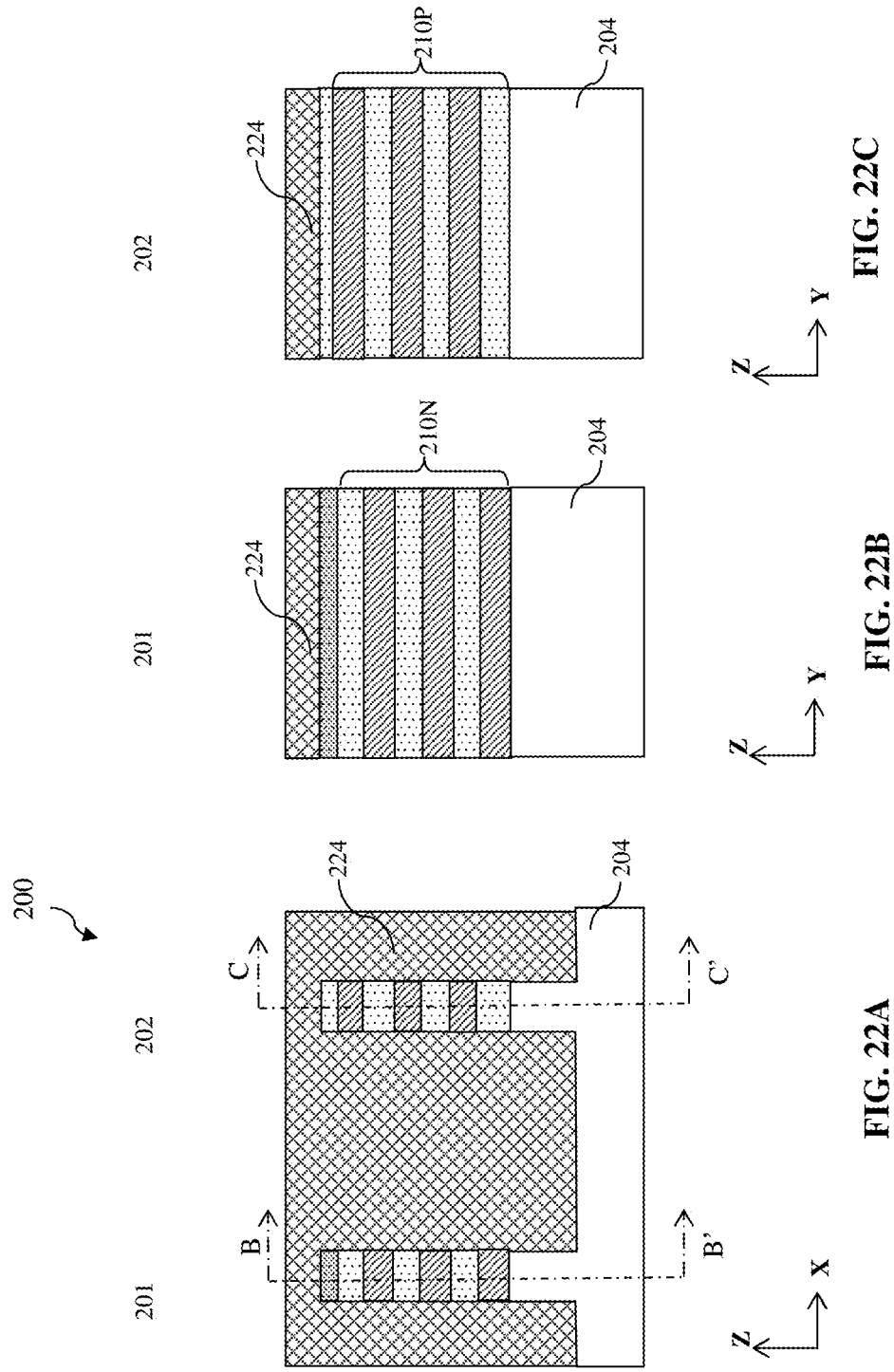

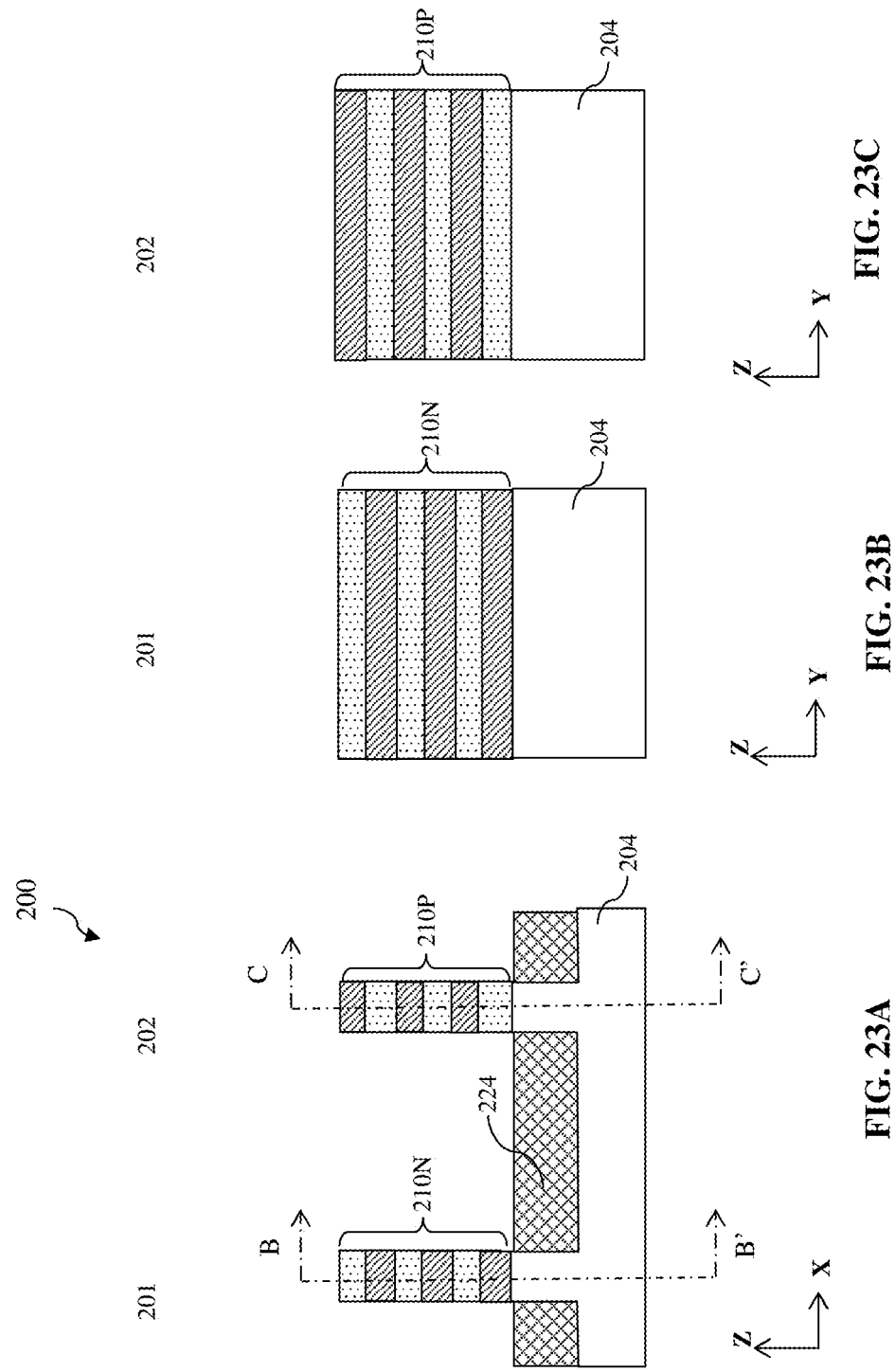

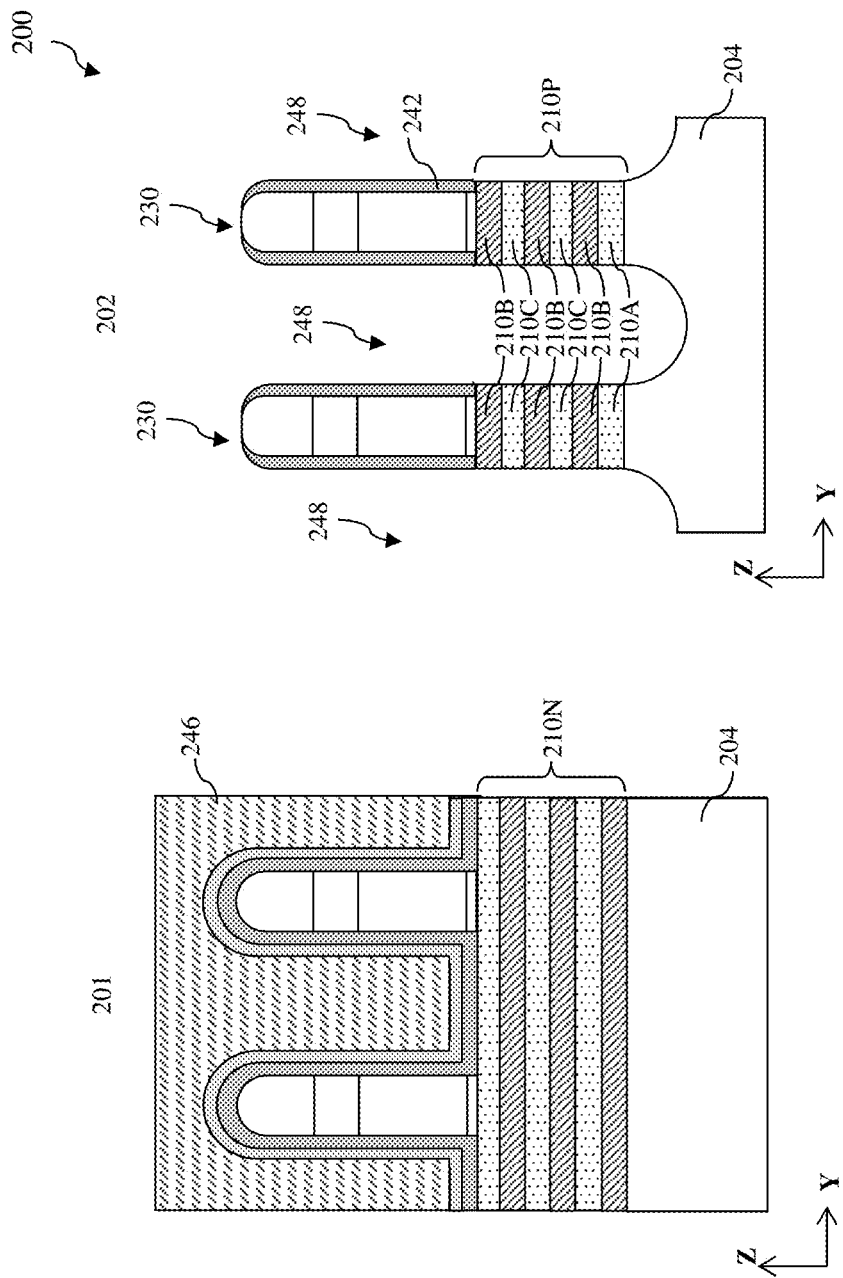

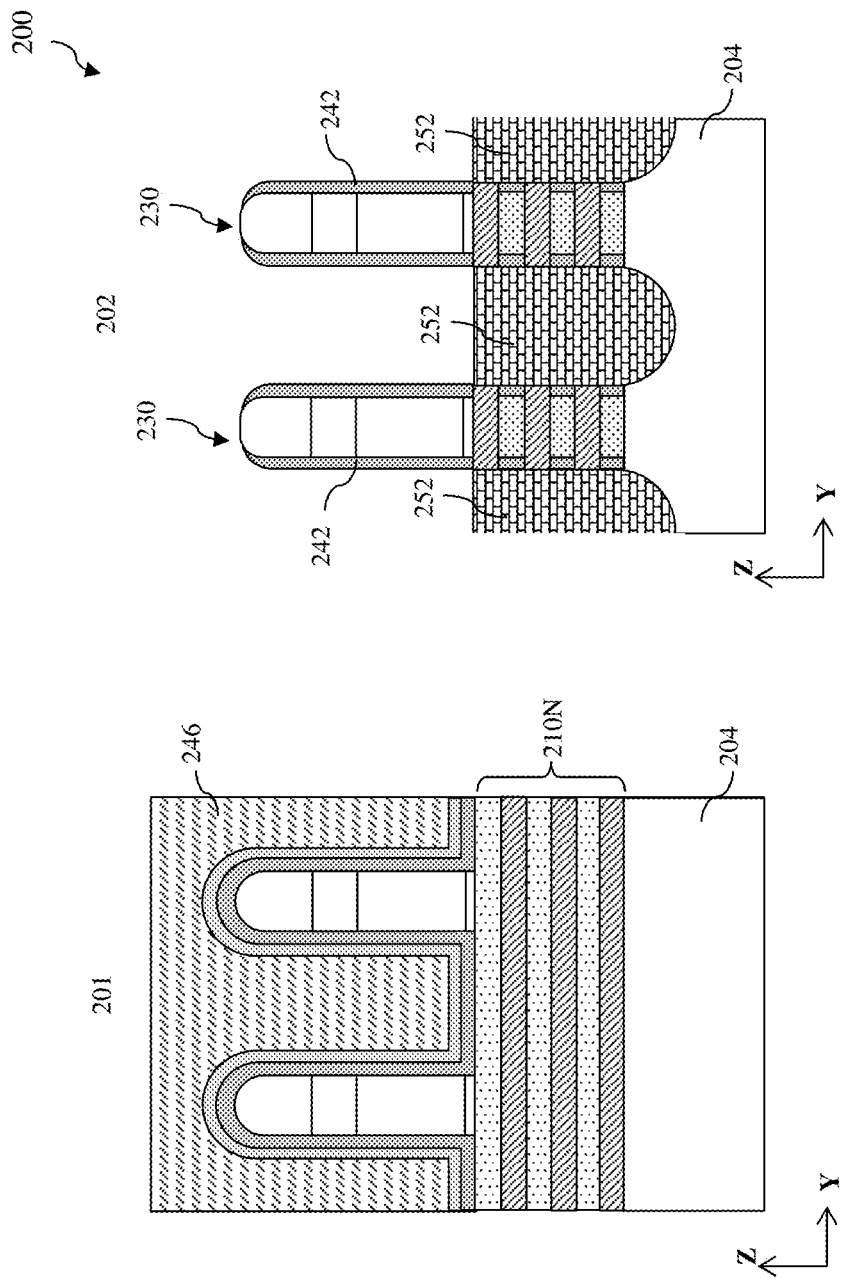

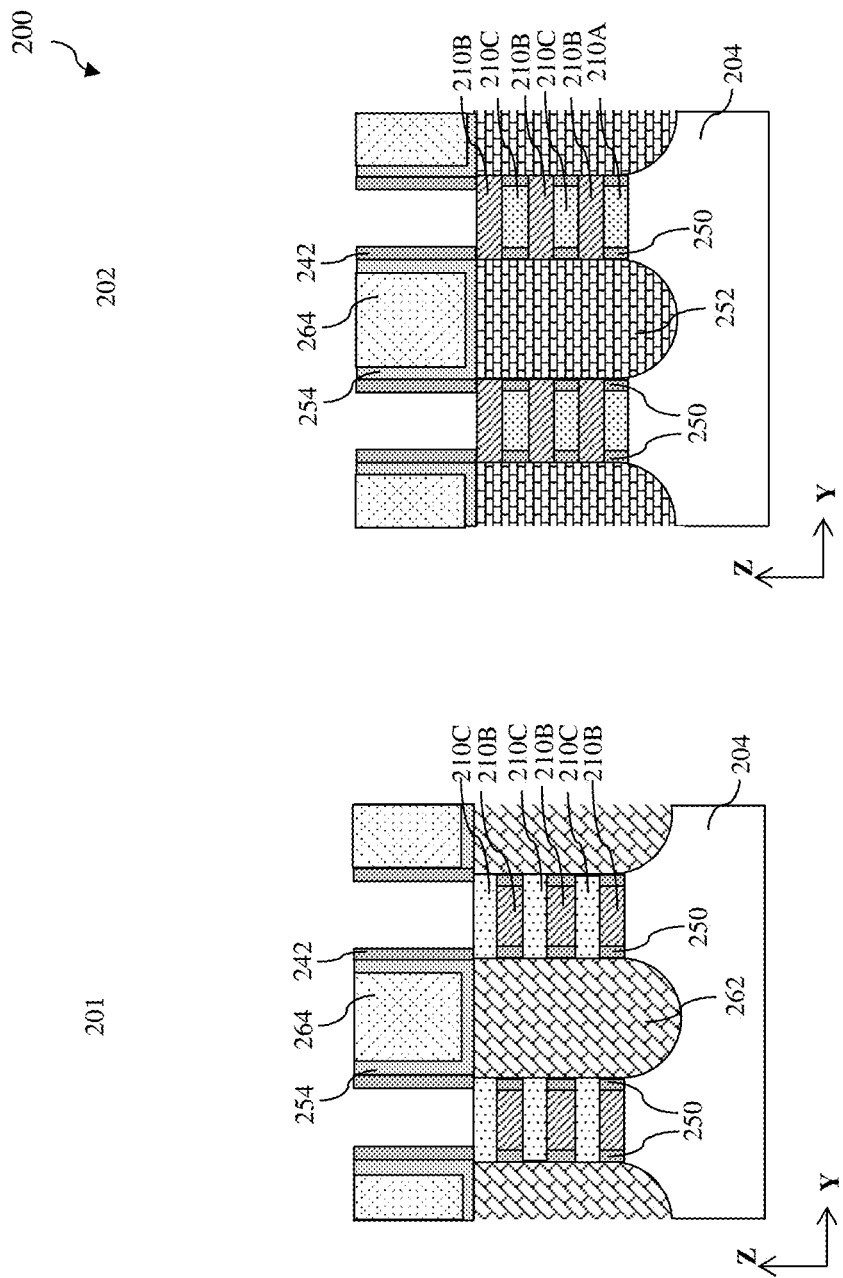

GATE-ALL-AROUND DEVICE WITH DIFFERENT CHANNEL SEMICONDUCTOR MATERIALS AND METHOD OF FORMING THE SAME

The present application is a continuation of U.S. patent application Ser. No. 16/938,401, filed Jul. 24, 2020, which claims benefit of U.S. Provisional Patent Application No. 62/906,188, filed Sep. 26, 2019, each of which is incorporated herein by reference in its entirety.

BACKGROUND

Multi-gate devices have been introduced to improve gate control by increasing gate-channel coupling and reducing off-state current. One such multi-gate device is a gate-all-around (GAA) device. A GAA device generally refers to any device having a gate structure, or portions thereof, formed on more than one side of a channel region (for example, surrounding a portion of the channel region). GAA transistors are compatible with conventional complementary metal-oxide-semiconductor (CMOS) fabrication processes and allow aggressive scaling down of transistors. However, fabrication of GAA devices presents challenges. For example, the n-type GAA field-effect-transistor (FET) and the p-type GAA FET may include channels with the same material. For example, both the n-type GAA FET and the p-type GAA FET include silicon (Si) channels. Therefore, the performance of the p-type GAA FET is degraded due to the Si channels. Improvements are thus needed.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 12A, 13A, 14A, 15A, 16A, 17A, 18A, 19A, 20A, 21A, 22A, and 23A illustrate schematic diagrams of the example semiconductor device comprising different types (n-type and p-type) of transistors at intermediate stages of the method 1100 of FIG. 11 in accordance with some embodiments of the present disclosure;

FIGS. 12B, 13B, 14B, 15B, 16B, 17B, 18B, 19B, 20B, 21B, 22B, and 23B illustrate schematic diagrams of the example semiconductor device comprising a first type (n-type) transistor along plane B-B' at intermediate stages of the method 1100 of FIG. 11 in accordance with some embodiments of the present disclosure;

FIGS. 12C, 13C, 14C, 15C, 16C, 17C, 18C, 19C, 20C, 21C, 22C, and 23C illustrate schematic diagrams of the example semiconductor device comprising a second type (p-type) transistor along plane C-C' at intermediate stages of the method 1100 of FIG. 11 in accordance with some embodiments of the present disclosure;

FIGS. 25A, 26A, 27A, 28A, 29A, 30A, 31A, 32A, 33A, 34A, 35A, 36A, 37A, 38A, and 39A illustrate schematic diagrams of the example semiconductor device comprising a first type (n-type) transistor along plane B-B' at intermediate stages of the method 2400 of FIG. 24 in accordance with some embodiments of the present disclosure; and FIGS. 25B, 26B, 27B, 28B, 29B, 30B, 31B, 32B, 33B, 34B, 35B, 36B, 37B, 38B, and 39B illustrate schematic diagrams of the example semiconductor device comprising a second type (p-type) transistor along plane C-C' at intermediate stages of the method 2400 of FIG. 24 in accordance with some embodiments of the present disclosure.

DETAILED DESCRIPTION

Figure 1:
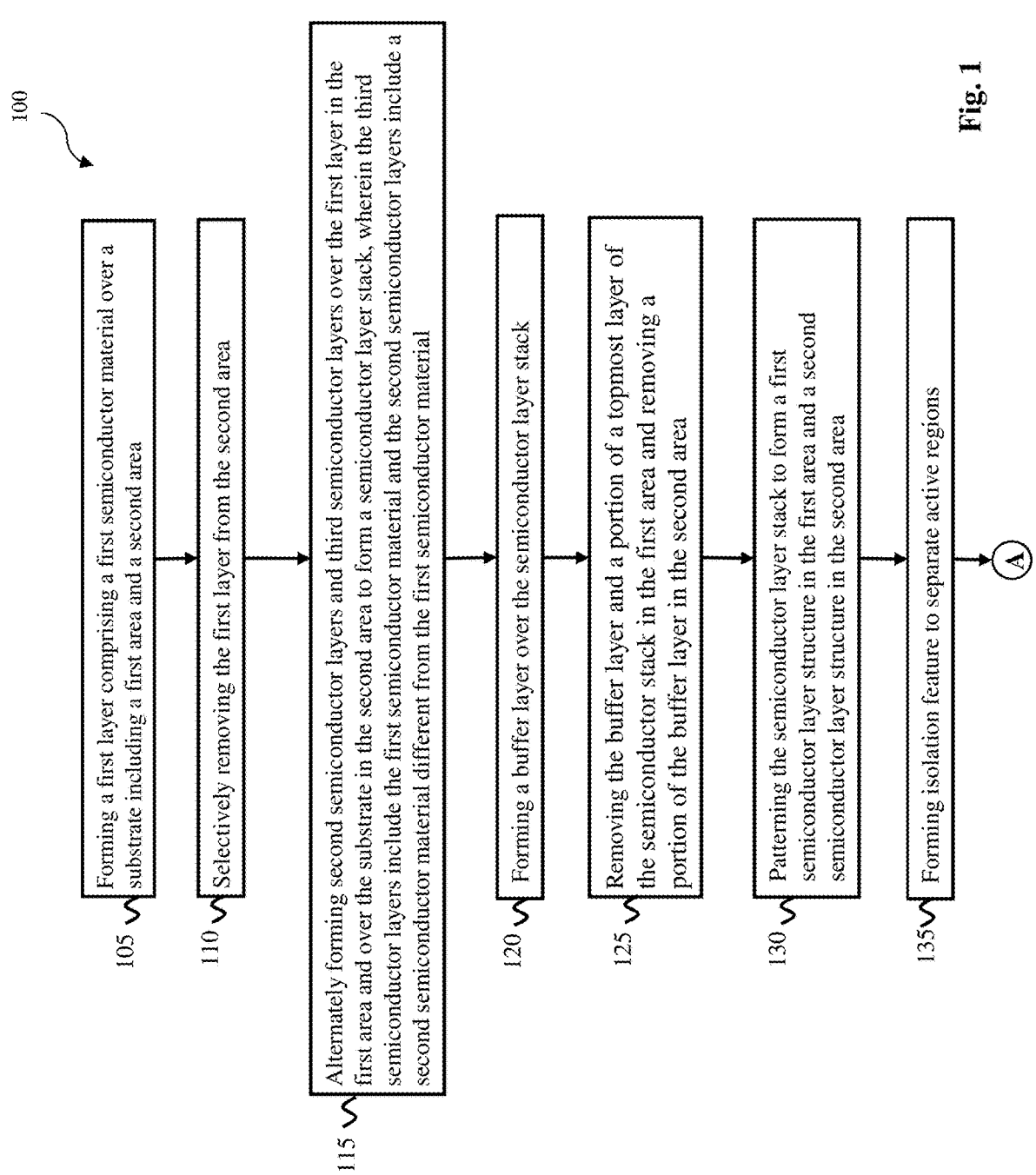
FIG. 1 illustrates a flowchart of an example method 100 for making an example semiconductor device in accordance with some embodiments of the present disclosure.
Figure 2:
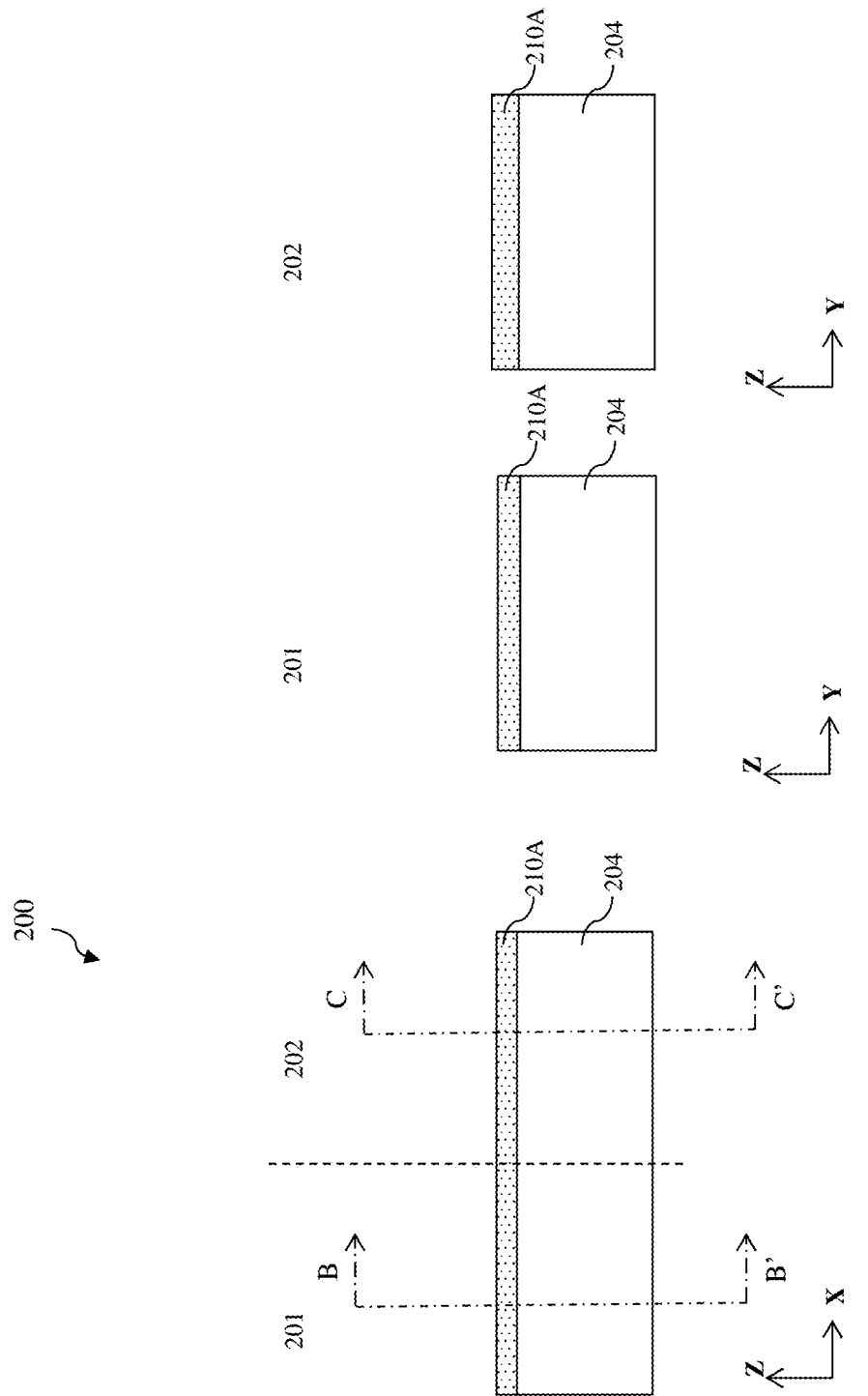
FIGS. 2A, 3A, 4A, 5A, 6A, 7A, 8A, 9A, and 10A illustrate schematic diagrams of the example semiconductor device comprising different types (n-type and p-type) of transistors at intermediate stages of the method 100 of FIG. 1 in accordance with some embodiments of the present disclosure.
FIGS. 2B, 3B, 4B, 5B, 6B, 7B, 8B, 9B, and 10B illustrate schematic diagrams of a first type (n-type) transistor in the example semiconductor device along plane B-B' at intermediate stages of the method 100 of FIG. 1 in accordance with some embodiments of the present disclosure.
FIGS. 2C, 3C, 4C, 5C, 6C, 7C, 8C, 9C, and 10C illustrate schematic diagrams of a second type (p-type) transistor in the example semiconductor device along plane C-C' at intermediate stages of the method 100 of FIG. 1 in accordance with some embodiments of the present disclosure.
Figure 3:
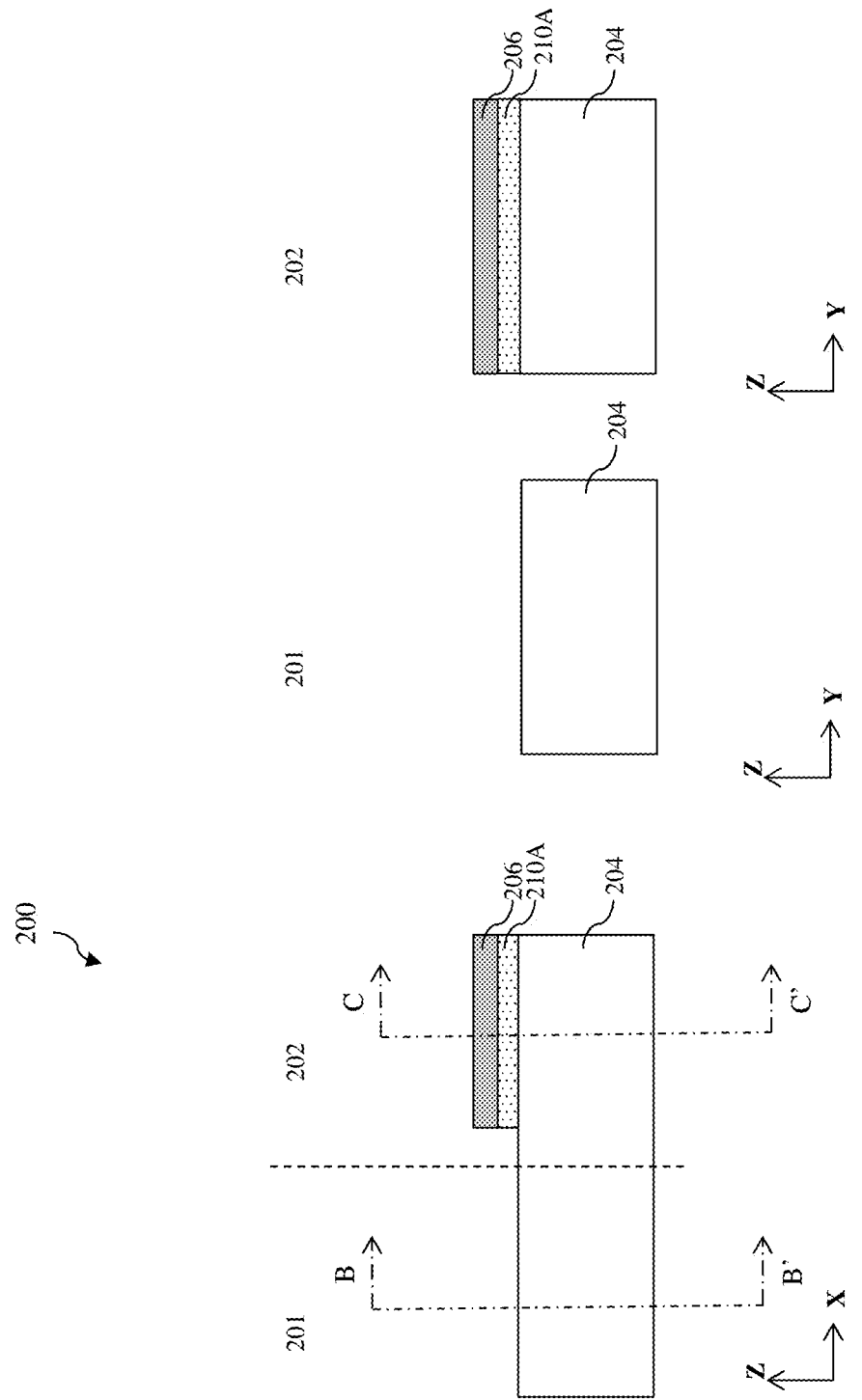
Figure 4:
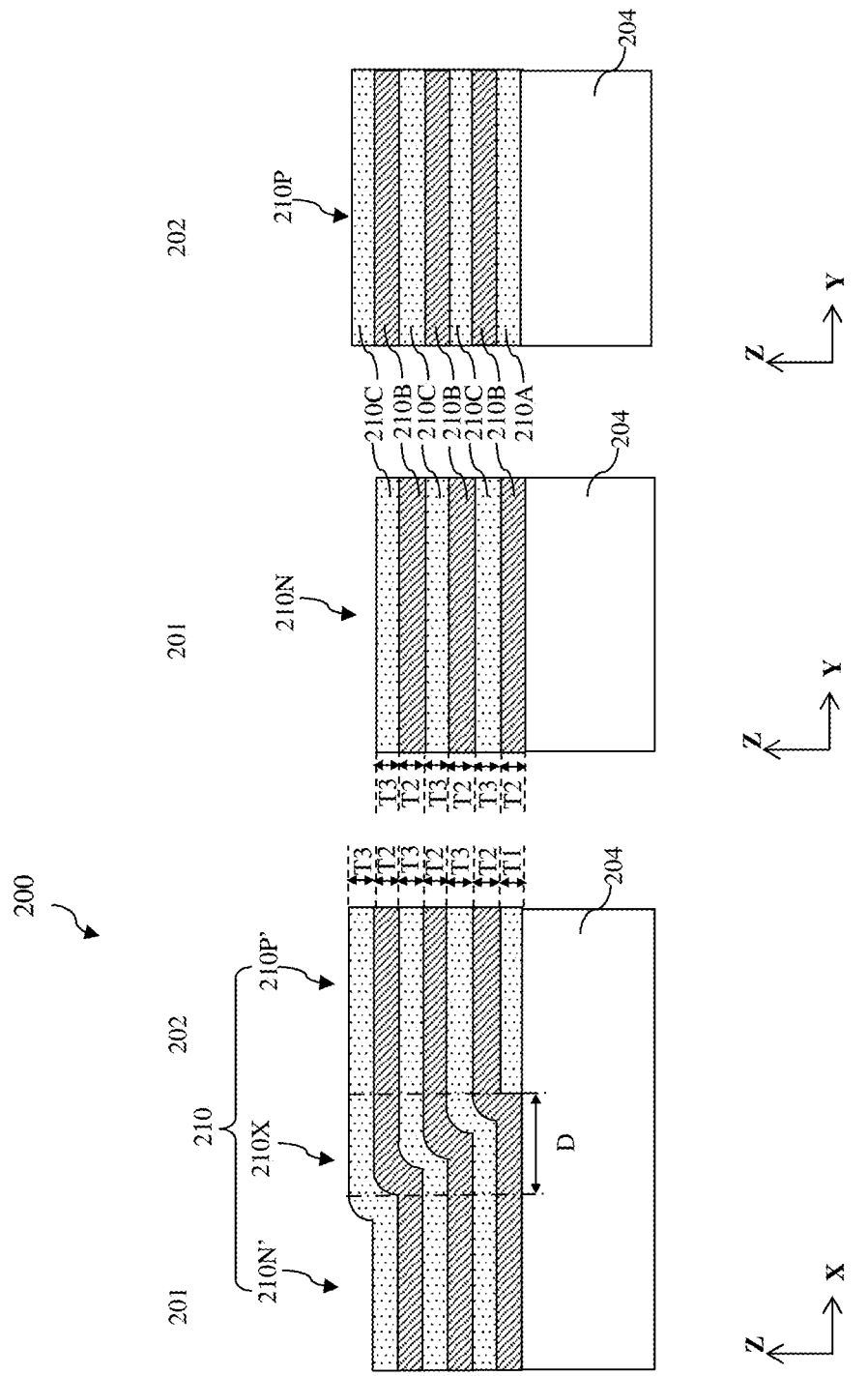
Figure 5:
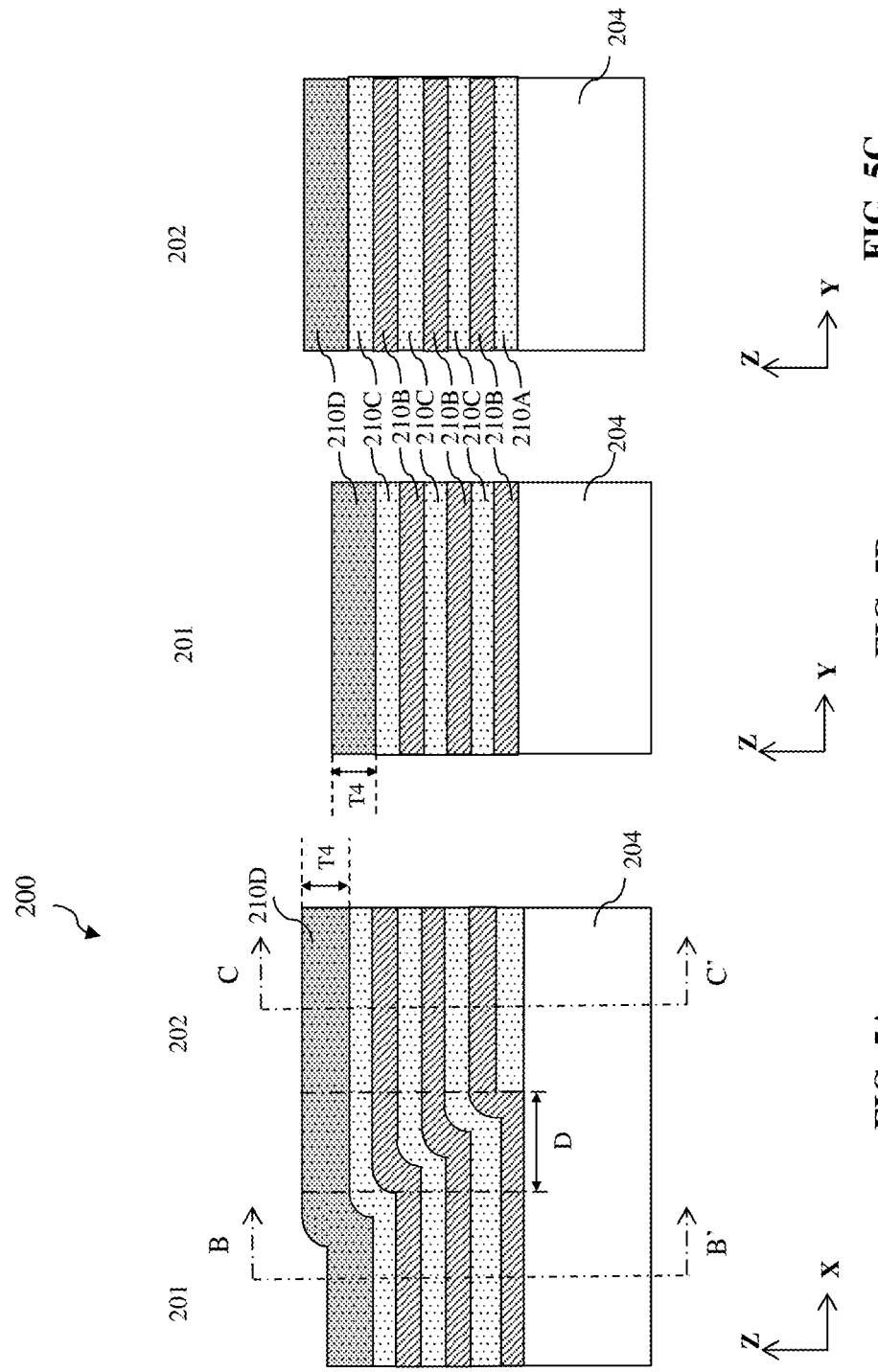
Figure 6:
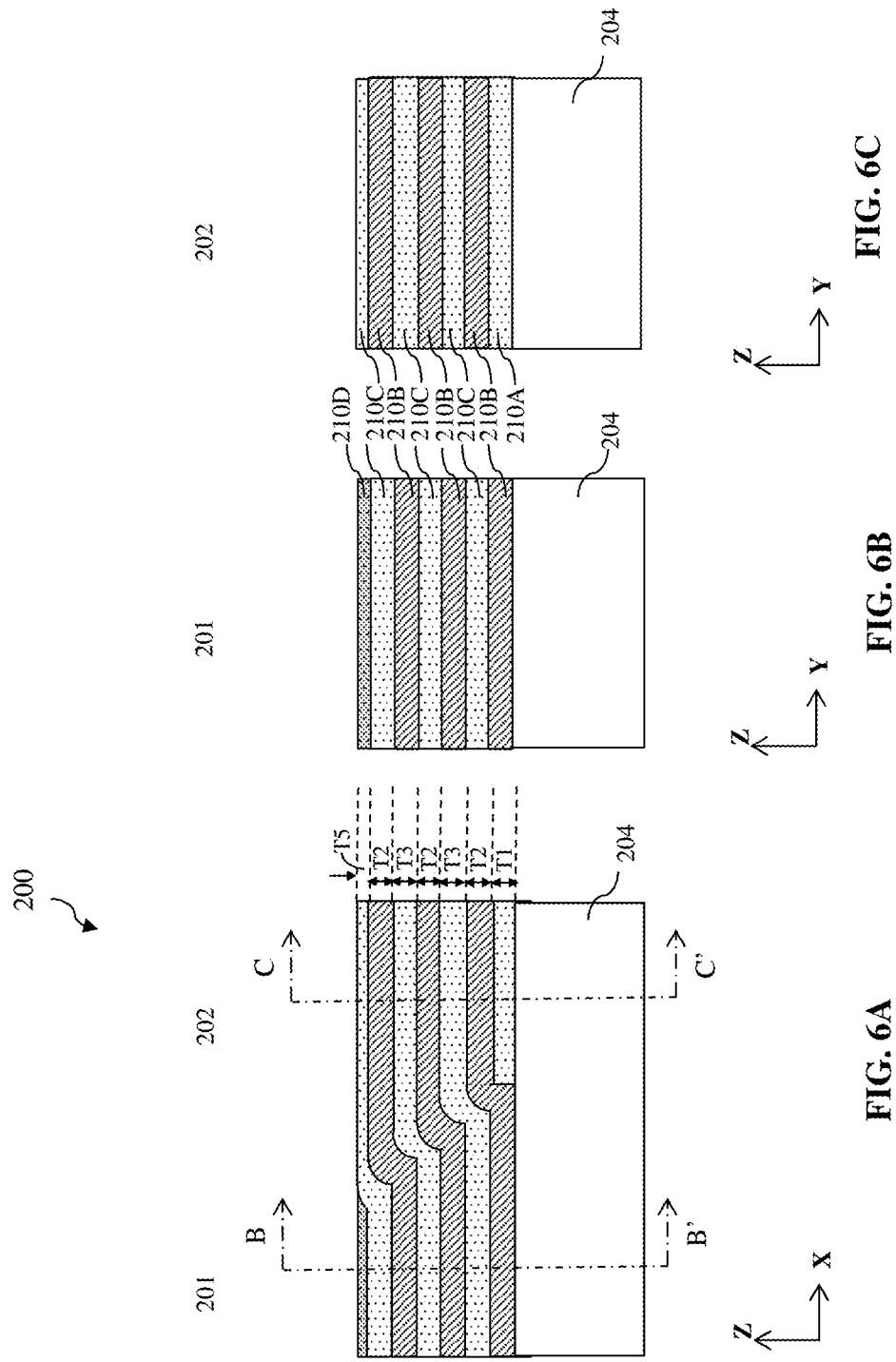
Figure 7:
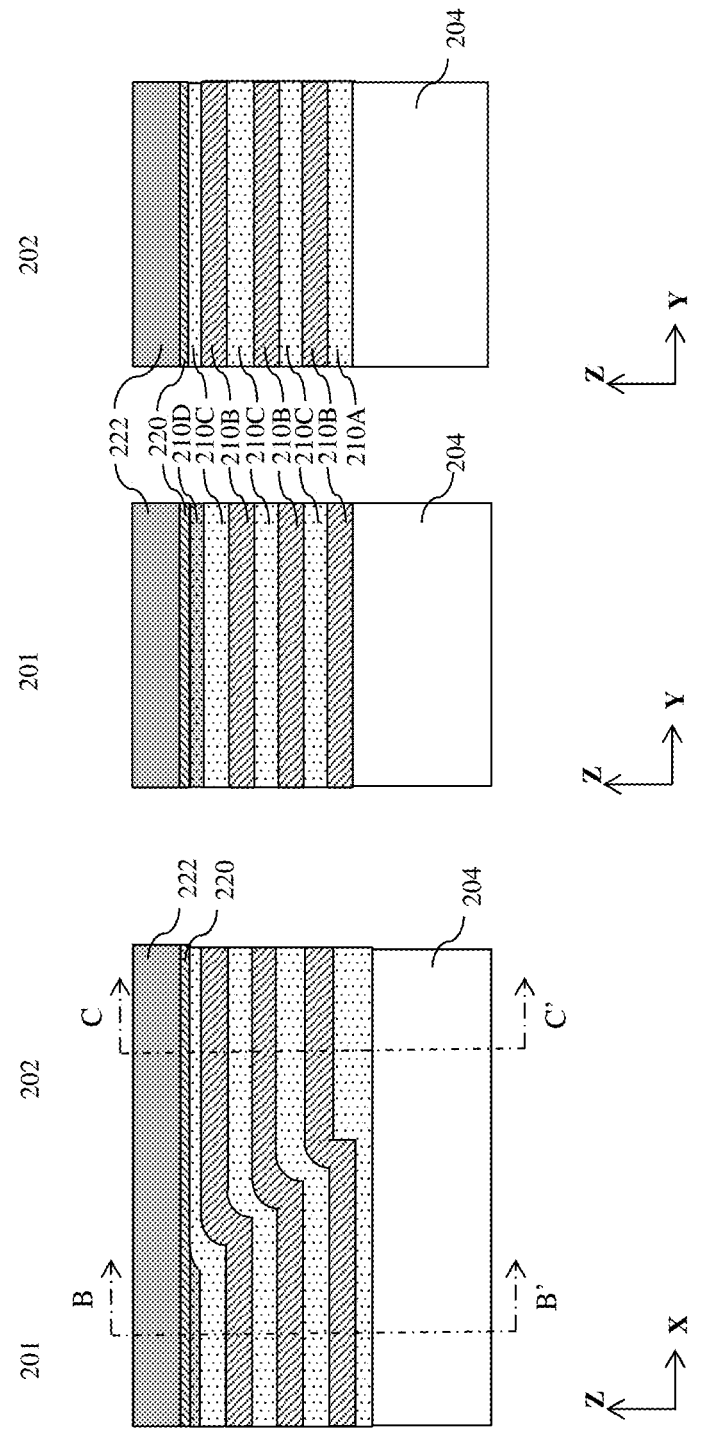
Figure 8:
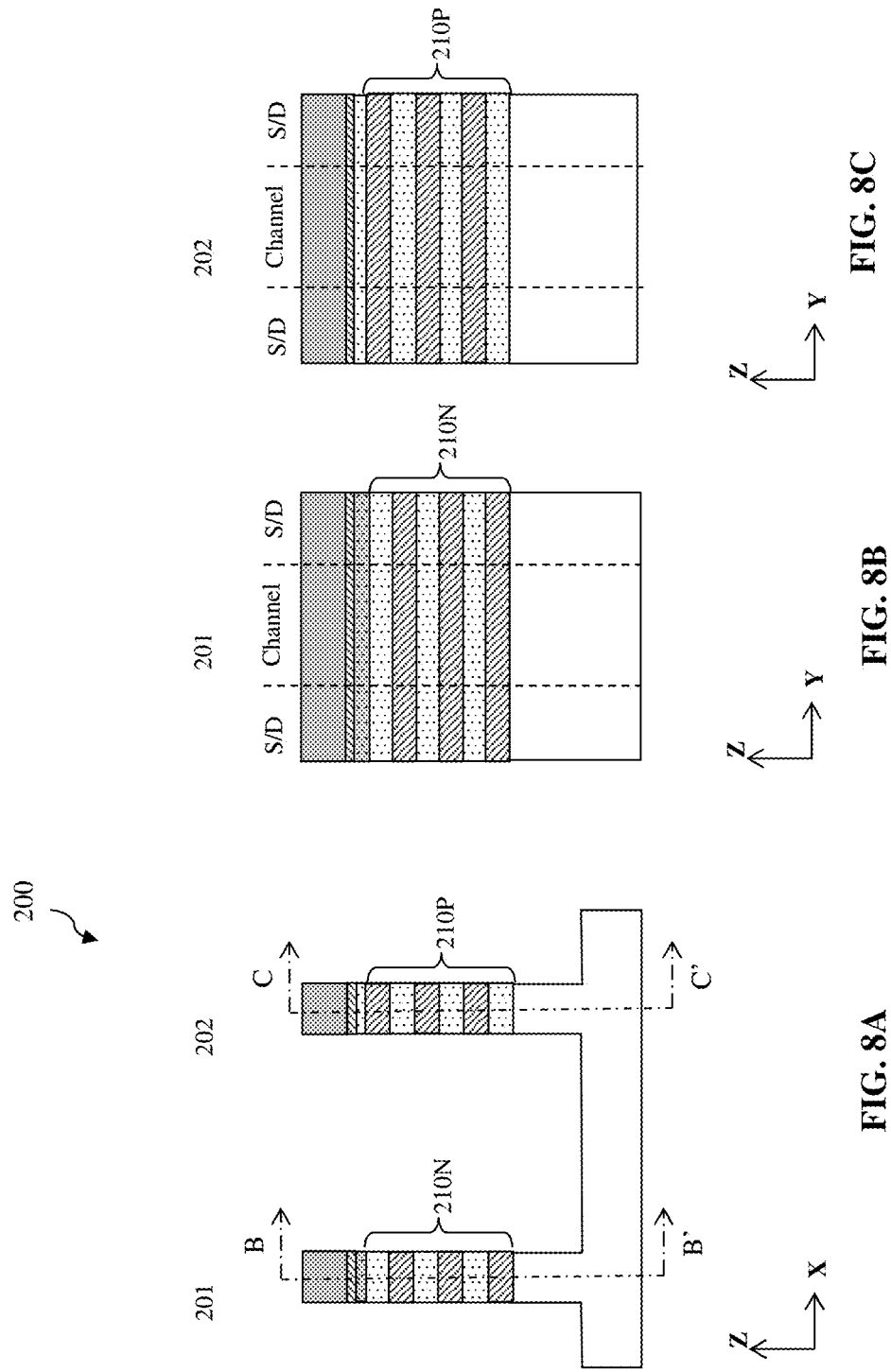
Figure 9:
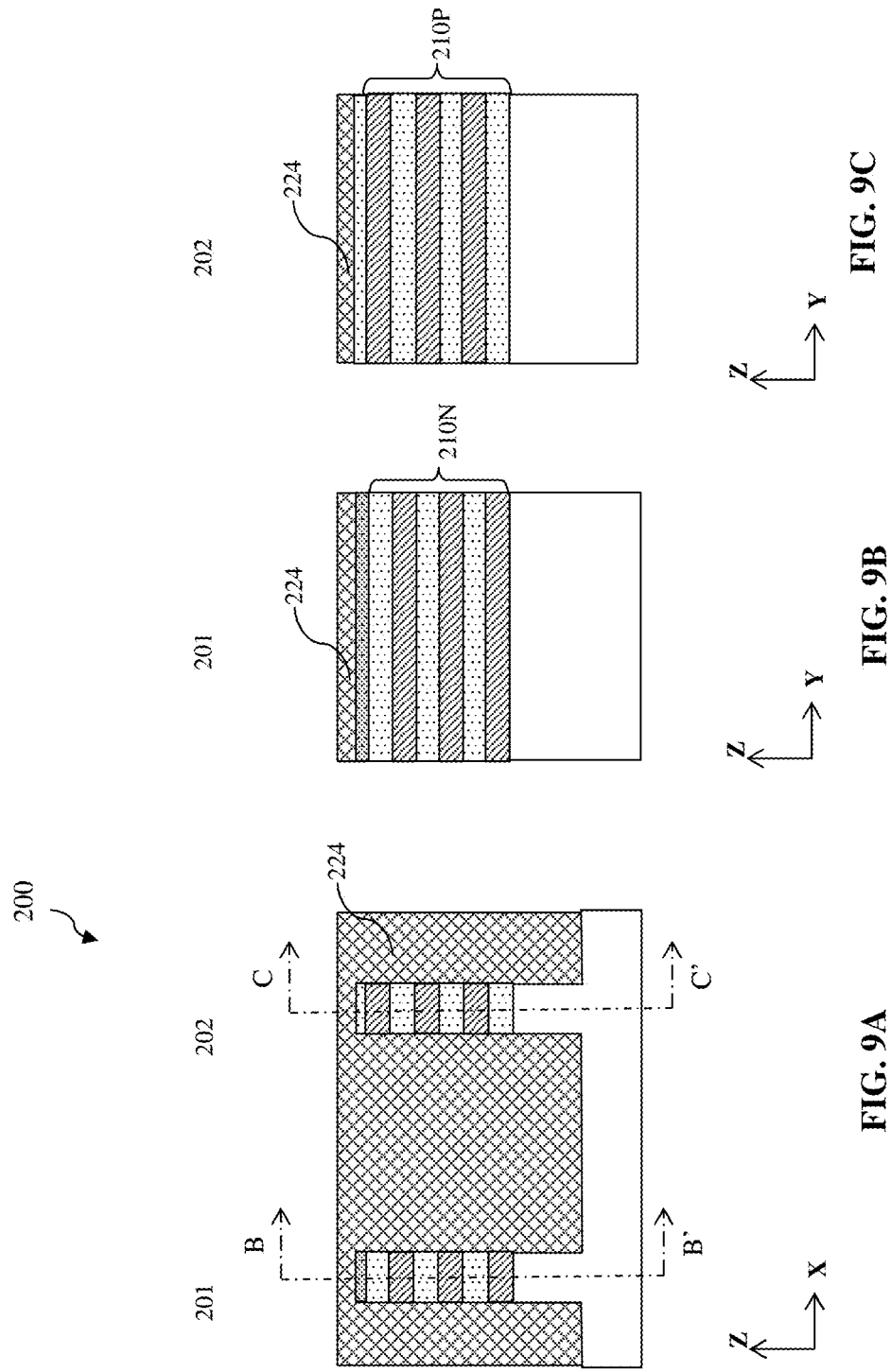
Figure 10:
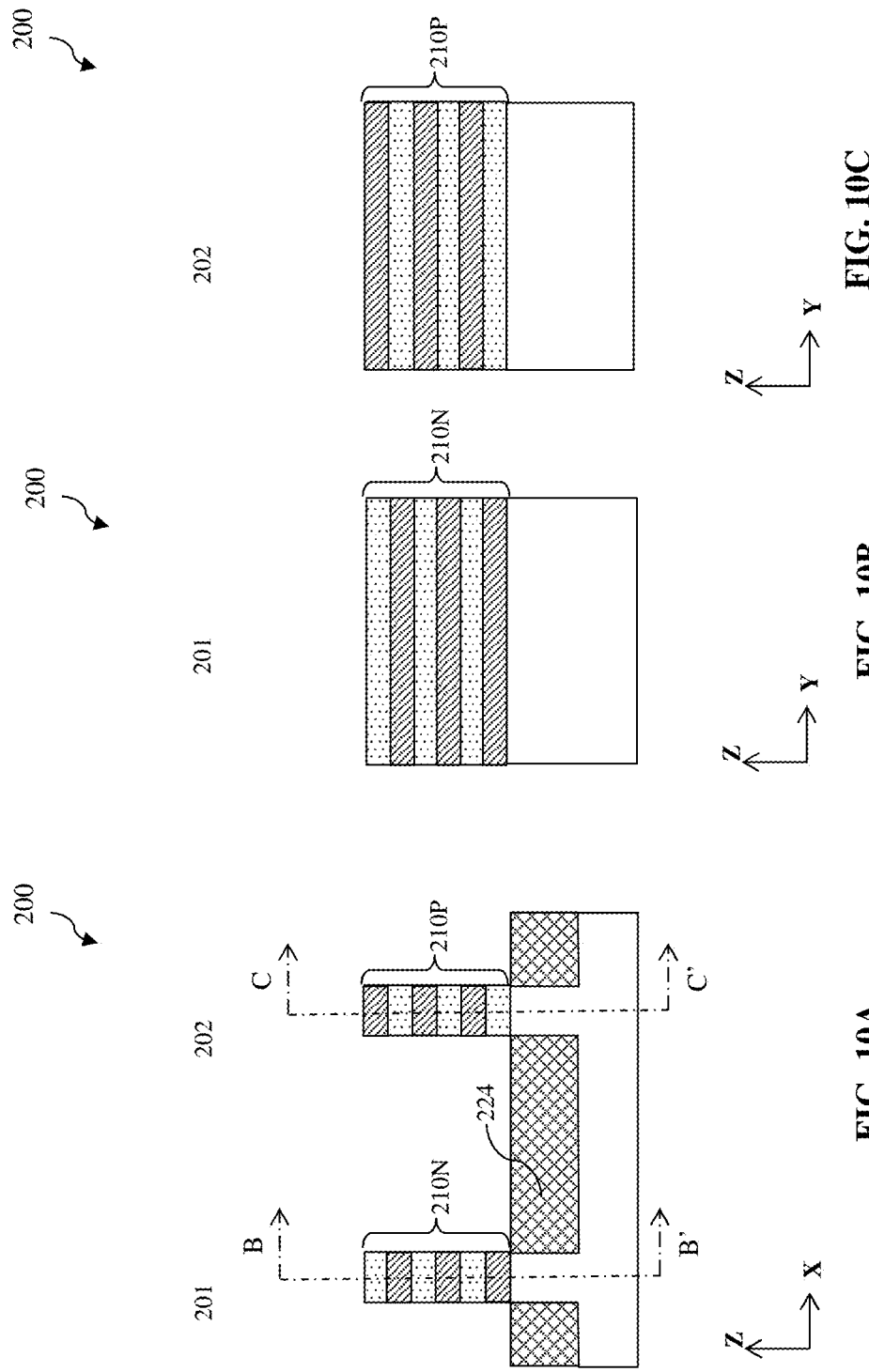

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is generally related to semiconductor devices and the fabrication thereof, and more particularly to methods of fabricating FETs, such as GAA FETs.

In a GAA device, a channel region of a single device may include multiple layers of semiconductor material physically separated from one another. In some examples, a gate of the device is disposed above, alongside, and even between the semiconductor layers of the device. This configuration may place more semiconductor material proximate to the gate and thereby improve the control of carriers through the channel region. In turn, the GAA device allows more aggressive gate length scaling for both performance and density improvement than a fin-like field-effect-transistor (FinFET) device. In a conventional GAA device, channels of n-type and p-type transistors are formed with the same material (for example, silicon (Si)). However, it is preferred that p-type transistor has a different channel material (for example, silicon germanium (SiGe)) to improve the performance thereof, for example better mobility and transconductance, and less parasitic resistance.

The present disclosure is generally related to fabrication of a CMOS GAA device. In the present disclosure, the CMOS GAA device includes different types of GAA transistors with different channel materials. For example, the CMOS GAA device includes a p-type GAA transistor with SiGe channel and a n-type GAA transistor with Si channel. The fabrication is integrated with the current processes and can be applied to multiple technology generations. For example, during the fabrication, a bottom Si layer is formed in the p-type area, but not the n-type area. Thereafter, SiGe layers and Si layers are alternately formed over the substrate in the n-type area and the bottom Si layer in the p-type area. In a later channel release process, the SiGe layers of the n-type transistor are removed and the Si layers of the p-type transistor are removed, thereby to form the Si channels for the n-type transistor and the SiGe channels for the p-type transistor. The performance of the CMOS GAA device can be improved since the p-type transistor has SiGe channels. Of course, these advantages are merely examples, and no particular advantage is required for any particular embodiment.

FIG. 1 illustrates a flow chart of a method 100 for making an example semiconductor device 200 (hereinafter, device 200) in accordance with some embodiments of the present disclosure. Method 100 is merely an example and is not intended to limit the present disclosure beyond what is explicitly recited in the claims. Additional operations can be performed before, during, and after method 100, and some operations described can be replaced, eliminated, or moved around for additional embodiments of the method. Method 100 is described below in conjunction with other figures, which illustrate various cross-sectional views of the semiconductor structures in device 200 during intermediate steps of method 100. In particular, FIGS. 2A-10A illustrate cross-sectional views of different types of transistors (n-type transistor and p-type transistor) of the device 200 (in a X-Z plane). FIGS. 2B-10B illustrate cross-sectional views of a n-type transistor in the device 200 taken along the plane B-B' (that is, in a Y-Z plane) at intermediate stages of the method 100. And, FIGS. 2C-10C illustrate cross-sectional views of a p-type transistor in the device 200 taken along the plane C-C' (that is, in the Y-Z plane) at intermediate stages of the method 100.

Device 200 may be an intermediate device fabricated during processing of an integrated circuit (IC), or a portion thereof, that may include static random-access memory (SRAM) and/or other logic circuits, passive components such as resistors, capacitors, and inductors, and active components such as p-type FETs (PFETs), n-type FETs (NFETs), fin-like FETs (FinFETs), metal-oxide semiconductor field effect transistors (MOSFET), complementary metal-oxide semiconductor (CMOS) transistors, bipolar transistors, high voltage transistors, high frequency transistors, and/or other memory cells. Device 200 can be a portion of a core region (often referred to as a logic region), a memory region (such as a static random access memory (SRAM) region), an analog region, a peripheral region (often referred to as an input/output (I/O) region), a dummy region, other suitable region, or combinations thereof, of an IC. In some embodiments, device 200 may be a portion of an IC chip, a system on chip (SoC), or a portion thereof. The present disclosure is not limited to any particular number of devices or device regions, or to any particular device configurations. FIGS. 2A-2C to 10A-10C, 12A-12C to 23A-23C, and 25A, 25B to 39A, 39B have been simplified for the sake of clarity to better understand the inventive concepts of the present disclosure. Additional features can be added in device 200, and some of the features described below can be replaced, modified, or eliminated in other embodiments of the device 200.

Referring to FIGS. 1, 2A-2C, at operation 105, a first semiconductor layer 210A is formed over a substrate 204 of the device 200. The substrate 204 is a bulk substrate that includes silicon. Alternatively or additionally, the bulk substrate includes another elementary semiconductor, such as germanium (Ge); a compound semiconductor, such as silicon carbide (SiC), silicon phosphide (SiP), gallium arsenide (GaAs), gallium phosphide (GaP), indium phosphide (InP), indium arsenide (InAs), indium antimonide (InSb), zinc oxide (ZnO), zinc selenide (ZnSe), zinc sulfide (ZnS), zinc telluride (ZnTe), cadmium selenide (CdSe), cadmium sulfide (CdS), and/or cadmium telluride (CdTe); an alloy semiconductor, such as SiGe, SiPC, GaAsP, AlInAs, AlGaAs, GaInAs, GaInP, and/or GaInAsP; other group III-V materials; other group II-IV materials; or combinations thereof. In some embodiments, the substrate 204 may include indium tin oxide (ITO) glass, include silicon on insulator (SOI) substrate, be strained and/or stressed for performance enhancement.

As depicted in FIG. 2A-2C, the substrate 204 may include various doped regions for various types of transistors. For example, the substrate 204 may include n-type doped regions (for example, n-type wells) for PFET and p-type doped regions (for example, p-type wells) for NFET. In some embodiments, the n-type doped regions are doped with n-type dopants, such as phosphorus (for example, $^{31}P$), arsenic, other n-type dopant, or combinations thereof; and the p-type doped regions are doped with p-type dopants, such as boron (for example, $^{11}B$, $BF_2$), indium, other p-type dopant, or combinations thereof. Referring to FIGS. 2A-2C, in the depicted embodiment, the NFET area 201 is a p-type doped region for NFETs (NFET area 201) and the PFET area 202 is a n-type doped region for PFETs (PFET area 202). The various doped regions can be formed directly on and/or in the substrate 204, for example, providing a p-well structure, an n-well structure, a dual-well structure, a raised structure, or combinations thereof. An ion implantation process, a diffusion process, and/or other suitable doping process can be performed to form the various doped regions.

At operation 105, a first semiconductor layer 210A is deposited over the substrate 204. The first semiconductor layer 210A includes a first semiconductor material, for example, silicon (Si), silicon germanium (SiGe), or other materials such as germanium, a compound semiconductor such as silicon carbide, gallium arsenide, gallium phosphide, indium phosphide, indium arsenide, and/or indium antimonide, an alloy semiconductor such as GaAsP, AlInAs, AlGaAs, InGaAs, GaInP, and/or GaInAsP, or combinations thereof. The first semiconductor layer 210A is formed by a suitable deposition or epitaxy process. For example, a molecular beam epitaxy (MBE) process, a chemical vapor deposition (CVD) process, such as a metal organic CVD (MOCVD) process, and/or other suitable epitaxial growth processes.

Now referring to FIGS. 1 and 3A-3C, at operation 110, a portion of the first semiconductor layer 210A in one of the areas 201 and 202 is removed. In the depicted embodiment, the first semiconductor layer 210A includes Si, thus the portion of the first semiconductor layer 210A in the NFET area 201 is removed. In some other embodiments, the first semiconductor layer 210A may include SiGe, thus the portion of the first semiconductor layer 210A in the PFET area 202 should be removed. In the depicted embodiment, removing of the portion of the first semiconductor layer 210A in the NFET area 201 involves one or more photoresist and etching processes. For example, first, a photoresist layer 206 is deposited over the first semiconductor layer 210A. The photoresist layer 206 is patterned such that the portion of the first semiconductor layer 210A in the PFET area 202 is covered by the photoresist layer 206, while the first semiconductor layer 210A in the NFET area 201 is exposed. Subsequently, the exposed portion of the first semiconductor layer 210A in the NFET area 201 is removed by a suitable etching process, such as a dry etch, a wet etch, or combinations thereof. Thereby, the substrate 204 in the NFET area 201 is exposed on the top surface of device 200. In some embodiments, referring to FIG. 3A, a part of the portion of the first semiconductor layer 210A in the PFET area 202 adjacent to the NFET area 201 is also removed according to the design of device 200, thereby allow enough space for a boundary portion of a later formed semiconductor layer stack to be formed between the NFET area 201 and the PFET area 202. The removed part of the portion of the first semiconductor layer 210A in the PFET area 202 adjacent to the NFET area 201 is less than half of the portion of the first semiconductor layer 210A in the PFET area 202. The photoresist layer 206 over the remaining portion of the first semiconductor layer 210A is then removed by a suitable process.

Now referring to FIGS. 1 and 4A-4C, at operation 115, second semiconductor layers 210B and third semiconductor layers 210C are alternately deposited over the device, for example, over the first layer 210A in the PFET area 202 and over the substrate 204 in the NFET area 201. Due to the height difference between the areas 201 and 202 caused by the first semiconductor 210A, the second semiconductor layers 210B and the third semiconductor layers 210C are formed to have steps between the areas 201 and 202 as depicted in FIG. 4A. The first semiconductor layer 210A, the second semiconductor layers 210B, and third semiconductor layers 210C form a semiconductor layer stack 210 (hereinafter stack 210) including three portions, i.e. 210N', 201P', and 210X. The portion 210N' is formed in the NFET area 201 and includes the second semiconductor layers 210B and the third semiconductor layers 210C; the portion 210P' is formed in the PFET area 202 and includes the first semiconductor layer 210A, the second semiconductor layers 210B and the third semiconductor layers 210C; the portion 210X (also referred to as a boundary portion 210X) is formed between the areas 201 and 202 and includes the stepped second semiconductor layers 210B and third semiconductor layers 210C. The number of the semiconductor layers 210B and 210C in the stack 210 depends on the design of device 200. For example, the stack 210 may comprise one to ten layers of each of the semiconductor layers 210B and 210C. In some embodiments, different semiconductor layers 210A, 210B, and 210C in the stack 210 have the same thickness in the Z-direction. In some other embodiments, different semiconductor layers 210A, 210B, and 210C in the stack 210 have different thicknesses. As depicted in FIGS. 4A-4C, the first semiconductor layer 210A has a thickness T1, the second semiconductor layer 210B has a thickness T2, and the third semiconductor layer 210C has a thickness T3. In some embodiments, each of the thicknesses T1, T2, and T3 is about 5 nanometers (nm) to about 20 nm. In some embodiments, the thickness ratio of T1 to T2 is about 0.5 to about 2; the thickness ratio of T3 to T2 is about 0.5 to about 2; and the thickness ratio of T1 to T3 is about 0.5 to about 2. As depicted in FIG. 4A, the boundary portion 210X has a width D in the x-direction. In some embodiment, the width D is about 2 to about 10 times of the thickness T1, T2, or T3. For example, the width D is about 25 nm to about 100 nm.

In some embodiments, the second semiconductor layers 210B include a second semiconductor material which is different from the first semiconductor material of the first semiconductor layer 210A. The third semiconductor layers 210C include the first semiconductor material which is the same as the material of the first semiconductor layer 210A. In some embodiments, the first semiconductor layer 210A and the third semiconductor layers 210C may be undoped or substantially dopant-free. In other words, no intentional doping is performed when forming the first semiconductor layer 210A and the third semiconductor layers 210C. In some other embodiments, the semiconductor layers 210A and 210C may be doped with a p-type dopant, such as boron (B, $^{11}$B or BF2), gallium (Ga), or combinations thereof, or an n-type dopant, such as phosphorus (P, $^{31}$P), arsenic (As), or combinations thereof. The different semiconductor materials in the semiconductor layers 210B and the semiconductor layers 210A/210C have different oxidation rates and/or different etch selectivities. Thereby, in a later channel release process (a selective removing process), the first semiconductor layer 210A and the third semiconductor layers 210C can be removed simultaneously, while the second semiconductor layers 210B remain substantially unchanged; or, the second semiconductor layers 210B can be selectively removed, while the first semiconductor layer 210A and the third semiconductor layers 210C remain substantially unchanged. In the depicted embodiment, the first semiconductor layer 210A and the third semiconductor layers 210C comprise Si (doped or undoped), and the second semiconductor layers 210B comprise SiGe. Thus, the portion 210N' of the stack 210 is arranged with alternating SiGe/Si/SiGe/Si/ . . . layers from bottom to top in the NFET area 201 and the portion 210P' of the stack 210 is arranged with alternating Si/SiGe/Si/SiGe/Si/ . . . layers from bottom to top in the PFET area 202. The boundary portion 210X includes alternating SiGe/Si/SiGe/Si/ . . . layers from bottom to top between the NFET area 201 and the PFET area 202.

The semiconductor layers 210B and 210C are formed using any suitable process. In some embodiments, the semiconductor layers 210B and/or 210C are formed by suitable epitaxy process. For example, semiconductor layers comprising SiGe and Si are formed alternately over the substrate 204 in the NFET area 201 and over the first semiconductor layer 210A in the PFET area 202 by a molecular beam epitaxy (MBE) process, a chemical vapor deposition (CVD) process, such as a metal organic CVD (MOCVD) process, and/or other suitable epitaxial growth processes.

Now referring to FIGS. 1 and 5A-5C, at operation 120, a buffer layer 210D is deposited over the stack 210. In some embodiments, the buffer layer 210D includes a material that is the same as the material of the topmost layer of the stack 210. For example, in the depicted embodiment, the topmost layer of the stack 210 is a third semiconductor layer 210C including Si, thus the buffer layer 210D including the same material Si as the third semiconductor layer 210C. As depicted in FIG. 5A, the buffer layer 210D has a thickness T4 in the z-direction. In some embodiments, the thickness T4 is about 1.5 times to about 5 times of the thickness of the topmost semiconductor layer (in the depicted embodiment, the third semiconductor layer 210C) of the stack 210. The buffer layer 210D may be formed by a suitable deposition process, such as MBE, CVD, PVD, atomic layer deposition (ALD), other suitable deposition process, or combinations thereof. As depicted in FIG. 4A, due to the steps of the second semiconductor layers 210B and the third semiconductor layers 210C formed in the portion 210X, the buffer layer 210D also includes a step formed over the portion 210X of the stack 210.

Now referring to FIGS. 1 and 6A-6C, at operation 125, a planarization process is performed to the device 200 to remove at least a portion of the buffer layer 210D in the NFET area 201 and the PFET area 202. In some embodiments, the planarization process is a chemical mechanical polishing (CMP) process. Referring to FIGS. 6A and 6C, in the PFET area 202, the buffer layer 210D is completely removed as well as a top portion of the topmost semiconductor layer 210C, and a bottom portion of the topmost semiconductor layer 210C remains; in the NFET area 201, only a top portion of the buffer layer 210D is removed, and a bottom portion of the buffer layer 210D remains. In the depicted embodiment, the remained portion of the topmost semiconductor layer 210C in the PFET area 202 has a thickness T5 in the z-direction. In some embodiments, the thickness T5 of the remained portion of the topmost semiconductor layer 210C is about 30% to about 80% of the thickness T3 of the topmost semiconductor layer 210C. In some other embodiments, the topmost semiconductor layer 210C in the PFET area 202 and the buffer layer 210D in the NFET area 201 may be completely removed. Thereby, the topmost semiconductor layer remained in the PFET area 202 is the second semiconductor layer 210B, and the topmost semiconductor layer remained in the NFET area 201 is the third semiconductor layer 210C.

Now referring to FIGS. 1, 7A-7C, and 8A-8C, at operation 130, the semiconductor layer stack 210 is patterned to form a first semiconductor layer structure 210N in the NFET area 201 and a second semiconductor layer structure 210P in the PFET area 202. Referring to FIGS. 7A-7C, first, a hard mask layer 222 is deposited over the device. The hard mask layer 222 may be a single dielectric layer or multiple layers including suitable dielectric material(s), such as semiconductor oxide ($SiO_2$), semiconductor nitride ($Si_3N_4$), silicon carbonitride (SiCN), or combinations thereof. In some embodiment, the hard mask layer 222 is deposited by CVD, PVD, ALD, plating, other suitable methods, or combinations thereof. Thereafter, referring to FIGS. 8A-8C, the hard mask layer 222 is patterned by a photoresist process and an etching process, and the stack 210 is then etched using the patterned hard mask 222 to form the fin-like first semiconductor layer structure 210N (comprising semiconductor layers 210B and 210C) in the NFET area 201 and the fin-like second semiconductor layer structure 210P (comprising semiconductor layers 210A, 210B, and 210C) in the PFET area 202. In the depicted embodiment, the first semiconductor layer structure 210N comprises semiconductor layers of SiGe/Si/SiGe/Si . . . from bottom to top; and the second semiconductor layer structure 210P comprises semiconductor layers of Si/SiGe/Si/SiGe . . . from bottom to top. The boundary portion 210X is removed during the patterning to form the semiconductor layer structures 210N and 210P. The semiconductor layer structures 210N and 210P extends along the Y-direction and comprises at least one channel region interposing a source region and a drain region (hereinafter both referred to as S/D regions). The hard mask 222 is then removed by a suitable etching process.

Now referring to FIGS. 1, 9A-9C, and 10A-10C, at operation 135, an isolation feature 224 is formed over the substrate 204 to separate and isolate the active regions of device 200. Referring to FIGS. 9A-9C, one or more dielectric materials 224', such as $SiO_2$ and/or $Si_3N_4$, is deposited over the substrate 204 and the semiconductor layer structures 210N and 210P. The dielectric material(s) 224' may be deposited by CVD, physical vapor deposition (PVD), thermal oxidation, or other techniques. Subsequently, referring to FIGS. 10A-10C, the dielectric material(s) 224' is recessed (for example, by etching) to form the isolation feature 224. In some embodiments, a top surface of the isolation feature 224 is substantially coplanar with or lower than a bottom surface of the lowermost semiconductor layer in the stack 210, for example the lowermost first semiconductor layer 210A in the semiconductor layer structure 210P or the lowermost second semiconductor layer 210B in the semiconductor layer structure 210N, as depicted in FIG. 10A. Still at operation 135, the remaining portion of the buffer layer 210D over the first semiconductor layer structure 210N and the remaining portion of the topmost third semiconductor layer 210C over the second semiconductor layer structure 210P are also removed by a suitable process, such as a CMP or an etching process.

Figure 11:
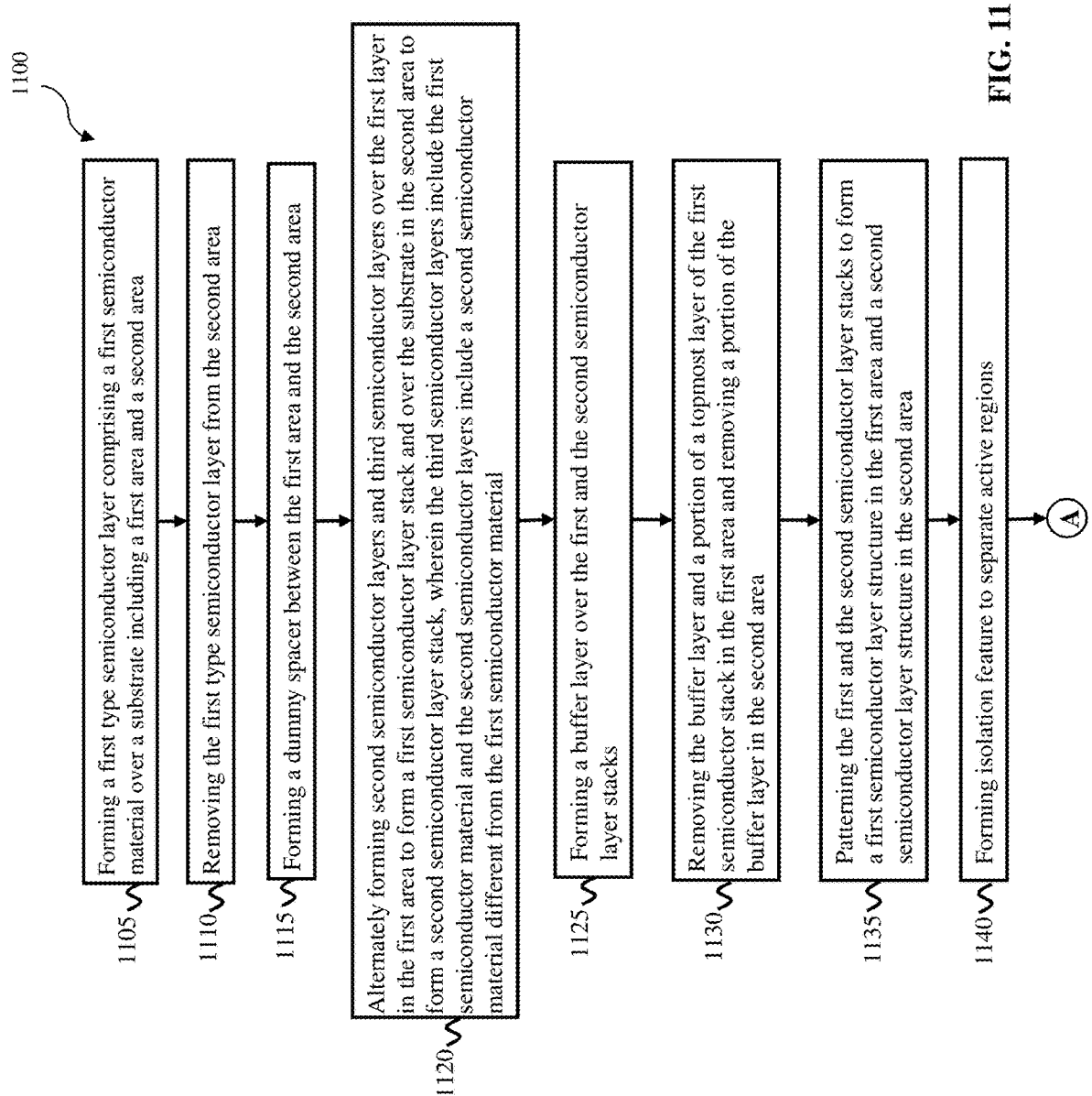
FIG. 11 illustrates a flowchart of an example method 1100 for making the example semiconductor device in accordance with some other embodiments of the present disclosure.

FIG. 11 illustrates a flow chart of another method 1100 for making the device 200 in accordance with some other embodiments of the present disclosure. Method 1100 is merely an example and is not intended to limit the present disclosure beyond what is explicitly recited in the claims. Additional operations can be performed before, during, and after method 1100, and some operations described can be replaced, eliminated, or moved around for additional embodiments of the method. Method 1100 is described below in conjunction with other figures, which illustrate various cross-sectional views of the semiconductor structures in device 200 during intermediate steps of method 1100. In particular, FIGS. 12A-23A illustrate cross-sectional views of different types of transistors (n-type transistor and p-type transistor) of the device 200 (in a X-Z plane). FIGS. 12B-23B illustrate cross-sectional views of a n-type transistor in the device 200 taken along the plane B-B' (that is, in a Y-Z plane) at intermediate stages of the method 1100. And, FIGS. 12C-23C illustrate cross-sectional views of a p-type transistor in the device 200 taken along the plane C-C' (that is, in the Y-Z plane) at intermediate stages of the method 1100. Same reference numbers in FIGS. 12A-12C to 23A-23C and FIGS. 2A-2C to 10A-10C refer to the same semiconductor components. And, the same semiconductor components in the aforementioned figures comprise the same materials and/or structures and are formed by the same process(es) unless it is explicitly recited in the following description.

Referring to FIGS. 11 and 12A-12C, at operation 1105, the first semiconductor layer 210A is formed over the substrate 204, including the NFET area 201 and the PFET area 202, of the device 200. As illustrated in FIG. 12A, the first semiconductor layer 210A has a thickness T1 in the Z-direction. In some embodiments, the thickness T1 is about 5 nm to about 20 nm.

Now referring to FIGS. 11 and 13A-13C, at operation 1110, a portion of the first semiconductor layer 210A in one of the NFET area 201 and the PFET area 202 is removed. In the depicted embodiment, the first semiconductor layer 210A includes Si, thus the portion of the first semiconductor layer 210A in the NFET area 201 is removed. In some other embodiments, the first semiconductor layer 210A may include SiGe, and the portion of the first semiconductor layer 210A in the PFET area 202 is removed. In the depicted embodiment, removing of the portion of the first semiconductor layer 210A in the NFET area 201 involves one or more photoresist and etching processes. For example, a photoresist layer 208 is deposited over the first semiconductor layer 210A. The photoresist layer 208 has a thickness T6 in the z-direction, such that the sum of the thickness T6 of the photoresist layer 208 and the thickness T1 of the first semiconductor layer 210A substantially equals to a height of a later formed dummy spacer (FIG. 15) separating the NFET area 201 and the PFET area 202. In some embodiments, the thicknesses T6 is equal to or greater than a sum of the thicknesses of the later deposited second semiconductor layers 210B and third semiconductor layers 210C (FIG. 17). For example, each of the semiconductor layers 210B and 210C has a thickness of about 5 nm to about 20 nm, and the device 200 comprises 1 to 10 layers of each of the semiconductor layers 210B and 210C, thus the thickness T6 is equal to or greater than about 10 nm to about 400 nm. Referring to FIG. 13A, the photoresist layer 208 is patterned such that the portion of the first semiconductor layer 210A in the PFET area 202 is covered by the photoresist layer 208, while the first semiconductor layer 210A in the NFET area 201 is exposed. Subsequently, the exposed portion of the first semiconductor layer 210A in the NFET area 201 is removed by a suitable etching process (such as a dry etch, a wet etch, or combinations thereof) and the substrate 204 in the NFET area 201 is exposed from a top surface of the device 200.

Figures 14A, 14B, 14C:
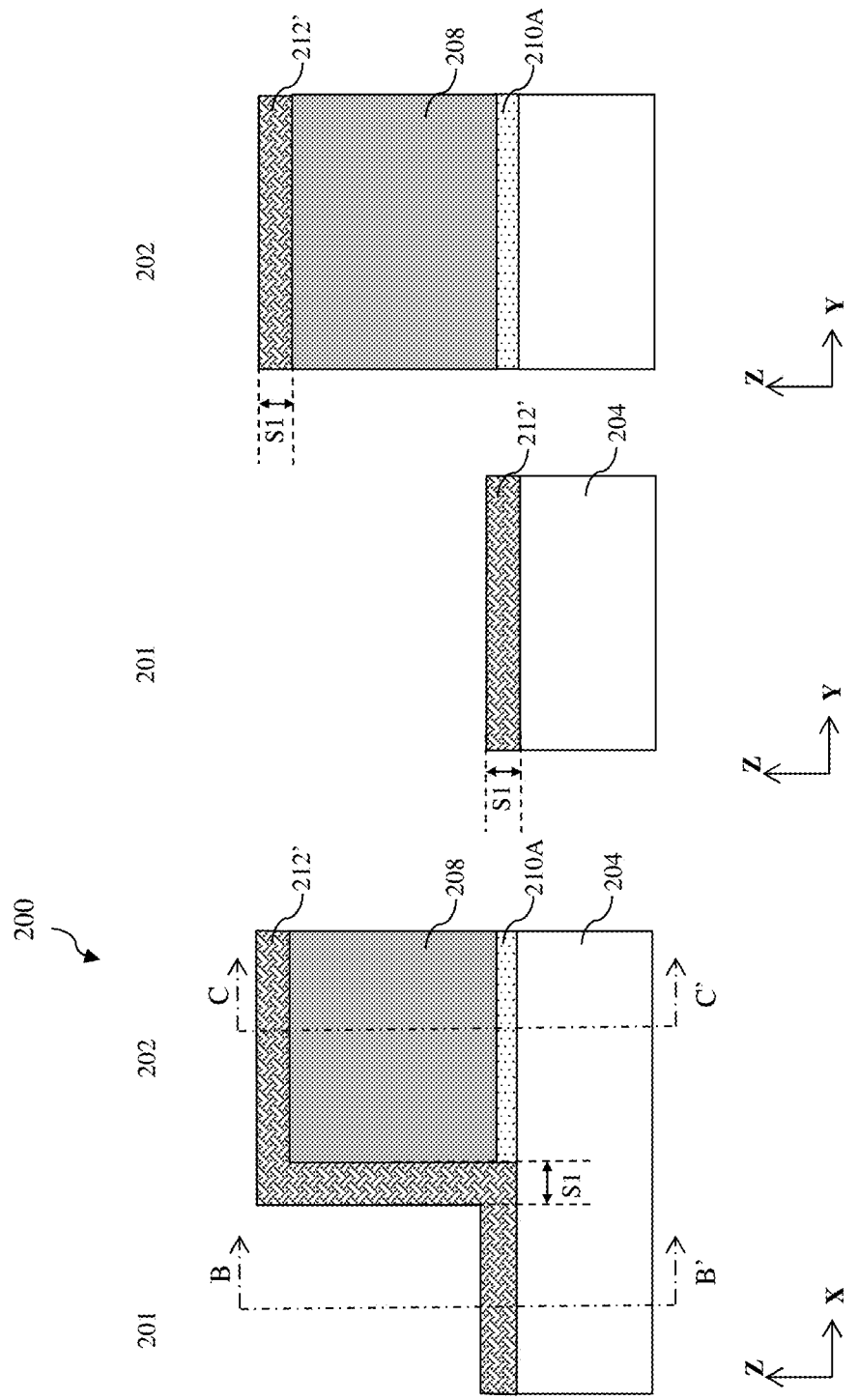
Figures 21A, 21B, 21C:
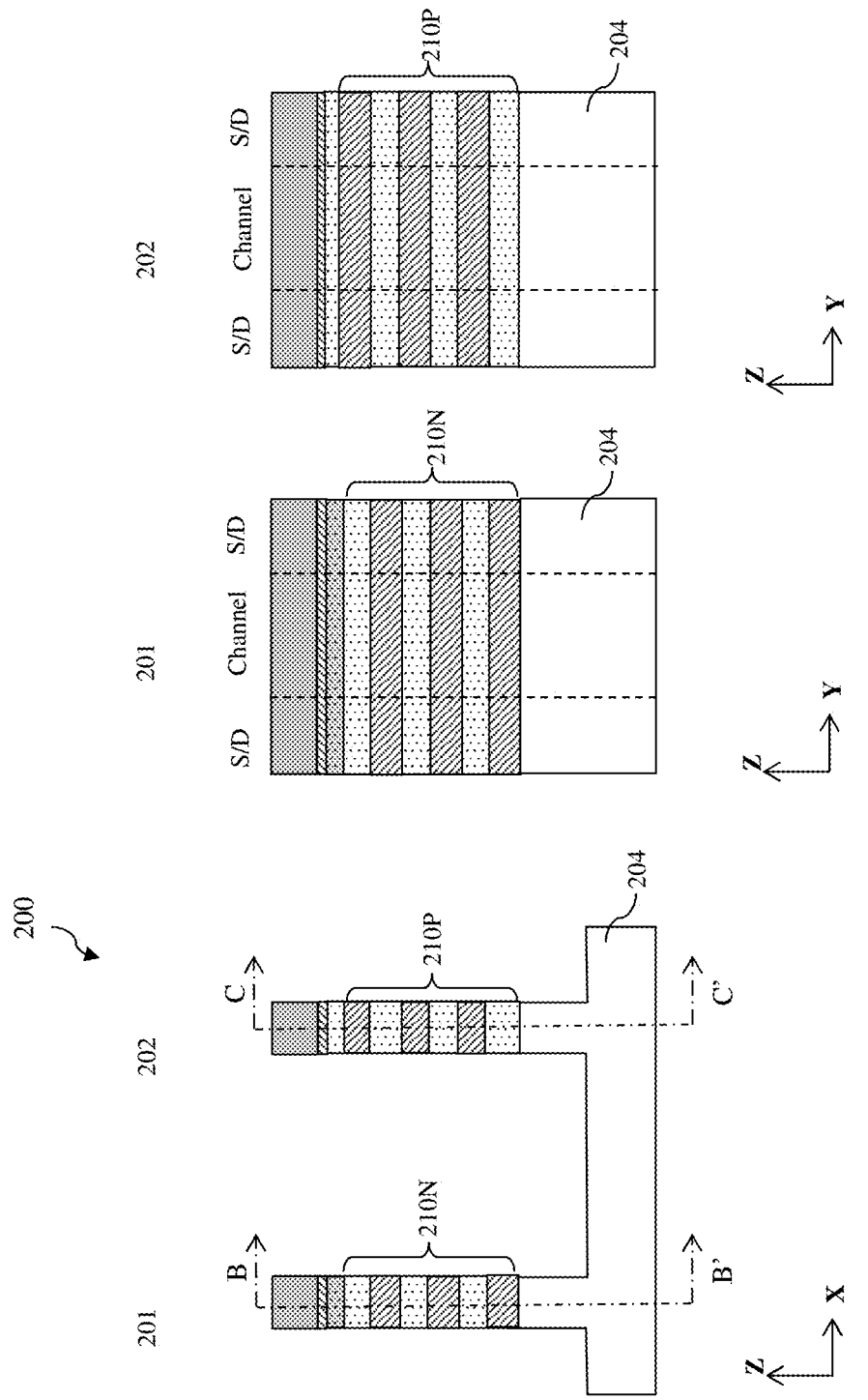

Now referring to FIGS. 11, 14A-14C, 15A to 15C, and 16A to 16C, at operation 1115, a dummy spacer 212 is formed between the NFET area 201 and the PFET area 202. Referring to FIGS. 14A-14C, first, a dummy spacer layer 212' is deposited over the device 200, for example, over the substrate 204 in the NFET area 201, along the sidewalls of the first semiconductor layer 210A and the photoresist layer 208, and over the photoresist layer 208 in the PFET area 202. In some embodiments, the dummy spacer layer 212' comprises a material which provides a low temperature resistant, such as SiO2, stannic oxide (SnO2), other suitable material, or combinations thereof. In some embodiments, the dummy spacer layer 212' is deposited by ALD, CVD, or other suitable process for a thickness S1 of about 8 nm to about 30 nm.

Thereafter, referring to FIGS. 15A-15C, an anisotropical etching process is applied to the dummy spacer layer 212' to remove the portion of the dummy spacer layer in the X-Y plane, while keep the portion of the dummy spacer layer along the Z-direction to form the dummy spacer 212. In some embodiments, a portion of the dummy spacer layer along the Z-direction may also be slightly removed, such that the dummy spacer 212 has a width S2 in the X-direction which is less than the thickness S1. For example, the width S2 of the dummy spacer 212 is about 5 nm to about 20 nm. The anisotropical etching process may be a dry etch, a wet etch, or combinations thereof. In some embodiments, the anisotropical etching process may be a wet etch using an etchant such as hydro fluoride (HF), phosphoric acid ($H_3PO_4$), or combinations thereof. In some other embodiments, the anisotropical etching process may be a dry etch using an etchant such as tetrafluoromethane ($CF_4$), octafluorocyclobutane ($C_4F_8$), fluoroform ($CHF_3$), and/or difluoromethane ($CH_2F_2$).

Subsequently, referring to FIGS. 16A-16C, the photoresist layer 208 over the first semiconductor layer 210A in the PFET area 202 is then removed by a suitable process, including a dry etch, a wet etch, or combinations thereof. As depicted in FIG. 16A, the dummy spacer 212 has a width S2 in the x-direction and a height T7 in the z-direction. In some embodiments, a ration of the height T7 to the width S2 is about 6 to about 12, such that the dummy spacer 212 may keep substantially perpendicular to the top surface of the substrate 204 without falling to the NFET area 201 or the PFET area 202.

Now referring to FIGS. 11 and 17A-17C, at operation 1120, second semiconductor layers 210B and third semiconductor layers 210C are alternately deposited over the substrate 204 in the NFET area 201 to form the semiconductor layer stack 210N" and over the first layer 210A in the PFET area 202 to form the semiconductor layer stack 210P". Referring to FIGS. 17A-17C, the semiconductor layer stack 210N" comprises the alternately deposited second semiconductor layers 210B and third semiconductor layers 210C, and the semiconductor layer stack 210P" comprises the first semiconductor layer 210A, and the alternately deposited second semiconductor layers 210B and third semiconductor layers 210C. As depicted in FIG. 17A, the semiconductor layer stacks 210N" and 210P" in different areas 201 and 202 are separated by the dummy spacer 212. Since the dummy spacer 212 has a width S2 which is less than the width D of the boundary portion 210X formed according to the method 100, the device 200 having the dummy spacer 212 formed by the method 1100 has more tolerance to the pattern shifting in later processes than the device 200 having the boundary portion 210X formed by the method 100.

Now referring to FIGS. 11 and 18A-18C, at operation 1125, a buffer layer 210D is deposited over the semiconductor layer stacks 210N" and 210P", as well as the dummy spacer 212. As depicted in FIG. 18A, due to the height differences between the semiconductor layer stacks 210N" and 210P" and the dummy spacer 212, the buffer layer 210D may include a step between the areas 201 and 202.

Now referring to FIGS. 11 and 19A-19C, at operation 1130, a planarization process (for example, a CMP process) is performed to the device 200, such that at least a portion of the buffer layer 210D in the NFET area 201 and the PFET area 202 are removed. Referring to FIGS. 19A and 19C, in the PFET area 202, the buffer layer 210D is removed, as well as a top portion of the topmost semiconductor layer 210C of the semiconductor layer stack 210P'. Thus, a bottom portion of the topmost semiconductor layer 210C remains in the PFET area 202. In the NFET area 201, a top portion of the buffer layer 210D is removed, while a bottom portion of the buffer layer 210D remains. As depicted in FIG. 19A, a top portion of the dummy spacer 212 is also removed such that a top surface of the dummy spacer 212 is substantially coplanar with the top surfaces of the remained portions of the semiconductor layers in the areas 201 and 202 (for example, the remained portion of the buffer layer 210D in the NFET area 201 and the remained portion of the topmost third semiconductor layer 210C in the PFET area 202). In the depicted embodiment, the remained portion of the topmost semiconductor layer 210C in the PFET area 202 has a thickness T5 in the z-direction. In some embodiments, the thickness T5 of the remained portion of the topmost semiconductor layer is about 30% to about 80% of the thickness (for example, T3) of the topmost semiconductor layer (for example, the third semiconductor layer 210C). In some other embodiments, the topmost semiconductor layer 210C in the PFET area 202 and the buffer layer 210D in the NFET area 201 may be completely removed.

Now referring to FIGS. 11, 20A-20C, and 21A-21C, at operation 1135, the semiconductor layer stacks 210N''' and 210P''' are patterned to form a first semiconductor layer structure 210N in the NFET area 201 and a second semiconductor layer structure 210P in the PFET area 202. The formation processes are similar as operation 130 of method 100. For example, referring to FIGS. 20A-20C, first, a hard mask 222 is deposited over the device 200. Thereafter, referring to FIGS. 21A-21C, the hard mask 222 is patterned, and the semiconductor layer stacks 210N' and 210P' are etched using the patterned hard mask 222 to form the fin-like first semiconductor layer structure 210N (comprising semiconductor layers 210B and 210C) in the NFET area 201 and the fin-like second semiconductor layer structure 210P (comprising semiconductor layers 210A, 210B, and 210C) in the PFET area 202. In the depicted embodiment, the first semiconductor layer structure 210N comprises semiconductor layers of SiGe/Si/SiGe/Si . . . from bottom to top; and the second semiconductor layer structure 210P comprises semiconductor layers of Si/SiGe/Si/SiGe . . . from bottom to top. The dummy spacer 212 is removed during the patterning to form the semiconductor layer structures 210N and 210P. The semiconductor layer structures 210N and 210P extends along the Y-direction and comprises at least one channel region interposing a source region and a drain region (hereinafter both referred to as S/D regions). The hard mask 222 is then removed by a suitable etching process.

Now referring to FIGS. 11, 22A-22C, and 23A-23C, at operation 1140, the isolation feature 224 is formed over the substrate 204 to separate and isolate the active regions of device 200. Formation of the isolation feature 224 is similar as the operation 135 of method 100 as discussed above. And similarly, the remained portion of the buffer layer 210D over the first semiconductor layer structure 210N and the remained portion of the topmost third semiconductor layer 210C over the second semiconductor layer structure 210P are also removed at operation 1140.

Figure 24:
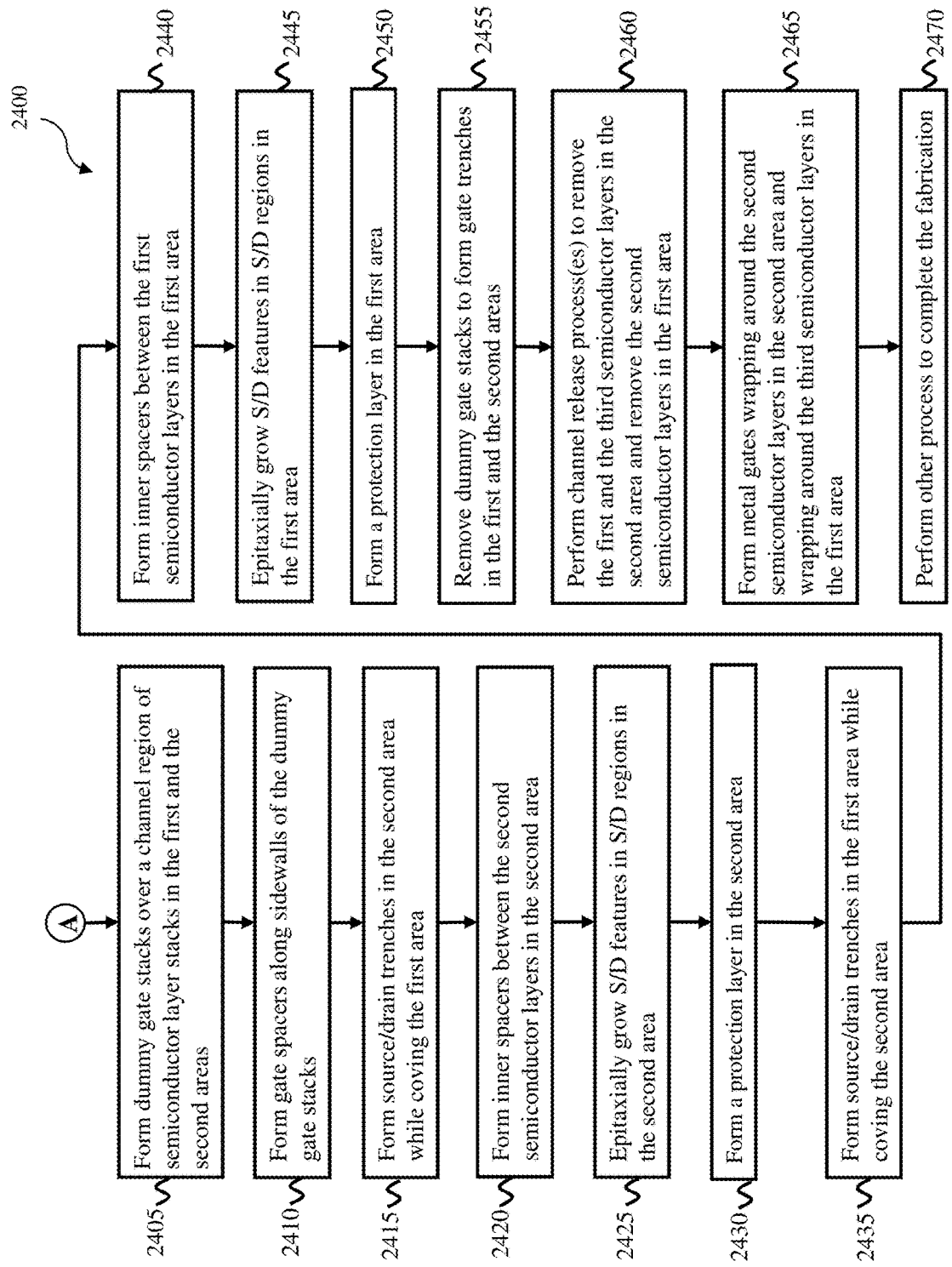
FIG. 24 illustrates a flowchart of an example method 2400 for making the example semiconductor device, following the method 100 of FIG. 1 or method 1100 of FIG. 11, in accordance with some embodiments of the present disclosure.

FIG. 24 illustrates a flow chart of a method 2400 following the method 100 or the method 1100 with further steps to fabricate the device 200 in accordance with some embodiments of the present disclosure. Method 2400 is merely an example and is not intended to limit the present disclosure beyond what is explicitly recited in the claims. Additional operations can be performed before, during, and after method 2400, and some operations described can be replaced, eliminated, or moved around for additional embodiments of the method. Method 2400 is described below in conjunction with other figures, which illustrate various cross-sectional views of the semiconductor structures in device 200 during intermediate steps of method 2400. In particular, FIGS. 25A-39A illustrate cross-sectional views of the n-type transistor in the device 200 taken along the plane B-B' (that is, in a Y-Z plane) at intermediate stages of the method 2400. FIGS. 25B-39B illustrate cross-sectional views of a p-type transistor in the device 200 taken along the plane C-C' (that is, in the Y-Z plane) at intermediate stages of the method 2400. Same reference numbers in FIGS. 25A, 25B to 39A, 39B, FIGS. 2A-2C to 10A-10C, and FIGS. 11A-11C to 23A-23C refer to the same semiconductor component. The same semiconductor components in the aforementioned figures comprise the same materials and/or structures and are formed by the same process(es) unless it is explicitly recited in the below description.

Figure 25A:
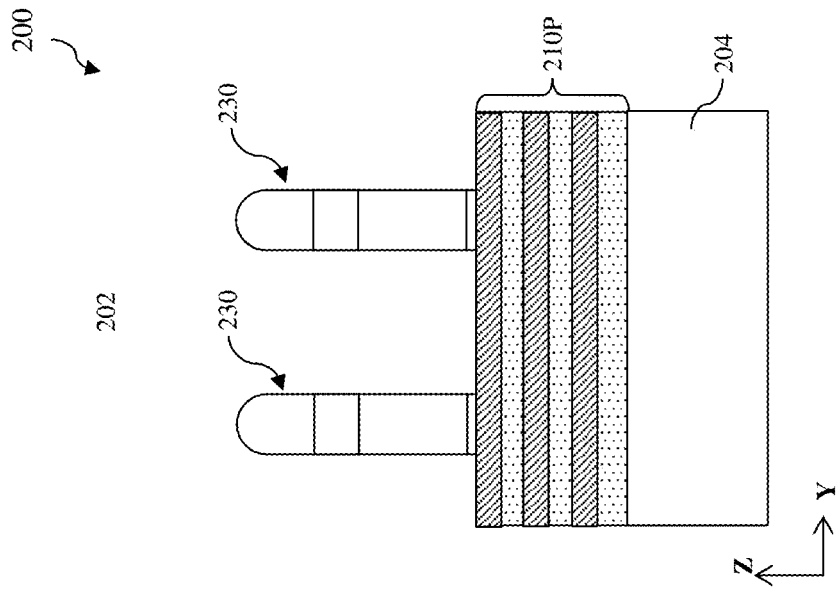
Figure 25B:
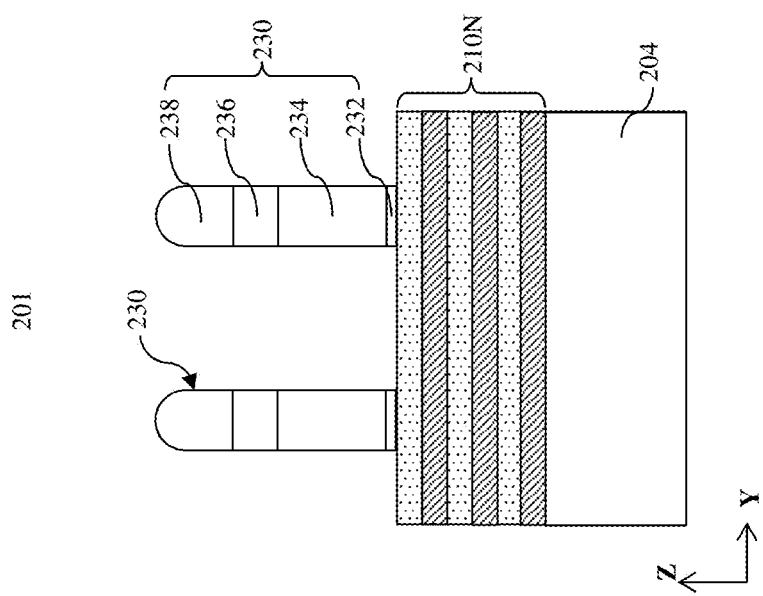

Referring to FIGS. 24, and 25A, 25B, at operation 2405, dummy gate stacks 230 are formed over the channel regions of the semiconductor layer structures 210N and 210P. Each dummy gate stack 230 serves as a placeholder for subsequently forming a metal gate stack. Dummy gate stacks 230 extend along the x-direction and may traverse several semiconductor layer structures 210N and 210P. Referring to FIGS. 25A and 25B, each dummy gate stack 230 includes a dummy gate electrode 234 and various other layers, for example, a first dummy gate hard mask layer 236 disposed over the dummy gate electrode 234, and/or a second dummy gate hard mask layer 238 disposed over the first dummy gate hard mask layer 236. Each dummy gate stack 230 may also include an interfacial layer 232 disposed between the semiconductor layer structures 210N or 210P and the dummy gate electrodes 234. The first and second dummy gate hard mask layers 236 and 238 (collectively referred to as the dummy gate hard mask) may each include a suitable dielectric material, such as $SiO_2$, SiCN, $Si_3N_4$, or other suitable dielectric material. The interfacial layer 232 may include any suitable material, for example, $SiO_2$, or other suitable dielectric material. The dummy gate electrode 234 can be a single layer structure or multiple layers comprising polysilicon. The dummy gate stacks 230 are formed by deposition processes, lithography processes, etching processes, other suitable processes, or combinations thereof.

Figure 26A:
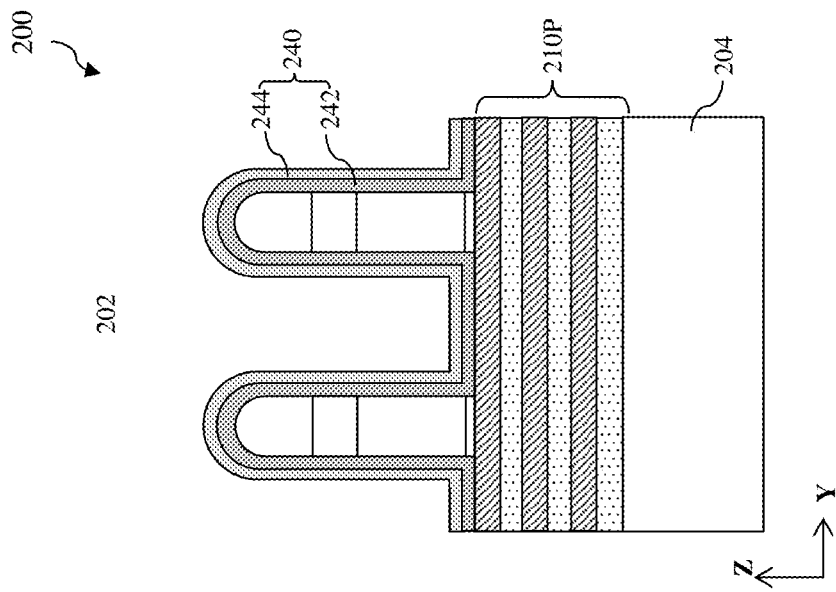
Figure 26B:
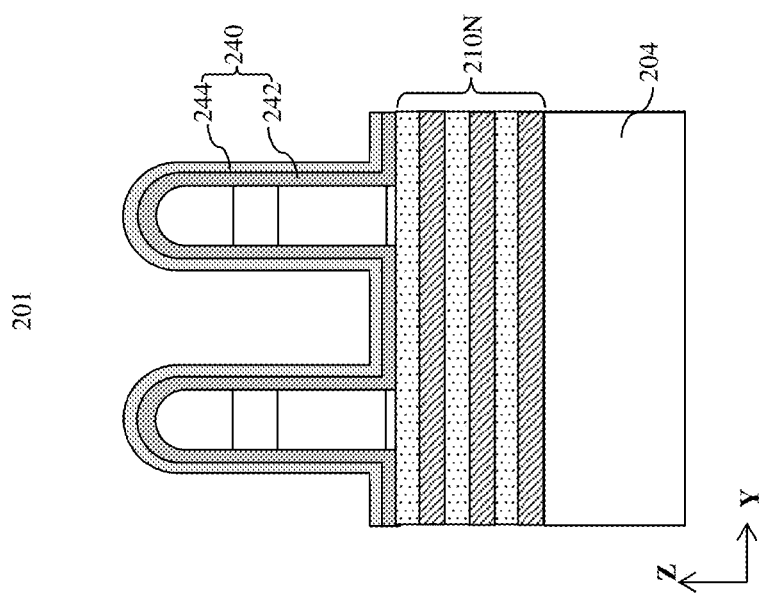

Referring to FIGS. 24, and 26A, 26B, at operation 2410, a gate spacer layer 240 is formed over the dummy gate stacks 230, the semiconductor layer structures 210N and 210P, and the substrate 204. The gate spacer layer 240 may be a single layer or multiple layers. In the depicted embodiment, the gate spacer layer 240 including a first spacer layer 242 and a second spacer layer 244 is formed conformally over the dummy gate stacks 230. Each of the first spacer layer 242 and the second spacer layer 244 includes a suitable dielectric material, such as $SiO_2$, $Si_3N_4$, silicon oxynitride (SiON), silicon carbide (SiC), or other low-K (K<3.9) dielectric materials. The first spacer layer 242 and the second spacer layer 244 include different dielectric compositions, such that an etching selectivity exists between the dielectric spacer layers 242 and 244. The gate spacer layer 240 including the spacer layers 242 and 244 may be formed by any suitable method, such as ALD, CVD, PVD, other suitable methods, or combinations thereof.

Now referring to FIGS. 24 and 27A, 27B, at operation 2415, S/D trenches are formed in one of the areas 201 and 202, while the other area is protected by a hard mask. Referring to FIGS. 27A and 27B, in the depicted embodiment, the S/D trenches 248 is formed in the PFET area 202 first, while the NFET area 201 is protected by a hard mask. In some other embodiments, the S/D trenches are formed in the NFET area 201 first, while the PFET area 202 is protected. Formation of the S/D trenches involves various processes. For example, first, a hard mask 246 is deposited in the NFET area 201 to protect the NFET area 201 including the semiconductor layer structure 210N. Thereafter, a suitable etching process, such as a dry etch, a wet etch, or combinations thereof, is performed in the PFET area 202 to remove the portions of the semiconductor layer structure 210P in the S/D regions, thereby to form the S/D trenches 248. The etching is performed along the sidewalls of the gate spacers 240. In some embodiments, the second spacer layers 244 and top portions of the first spacer layers 242 are also removed. The portions of the semiconductor layer structure 210P covered by the first spacer layers 242 and the dummy gate stacks 230 remain substantially unchanged. The remained portions of the first spacer layers 242 form the gate spacers. Referring to FIGS. 27B, the sidewalls of the alternating semiconductor layers 210A, 210B, and 210C of the semiconductor layer structure 210P are exposed in the S/D trenches 248. The etching process may implement a dry etching process using an etchant including a bromine-containing gas (such as, HBr and/or $CHBR_3$), a fluorine-containing gas (such as, $CF_4$, $SF_6$, $CH_2F_2$, $CHF_3$, and/or $C_2F_6$), other suitable gases, or combinations thereof.

Figures 28A, 28B:
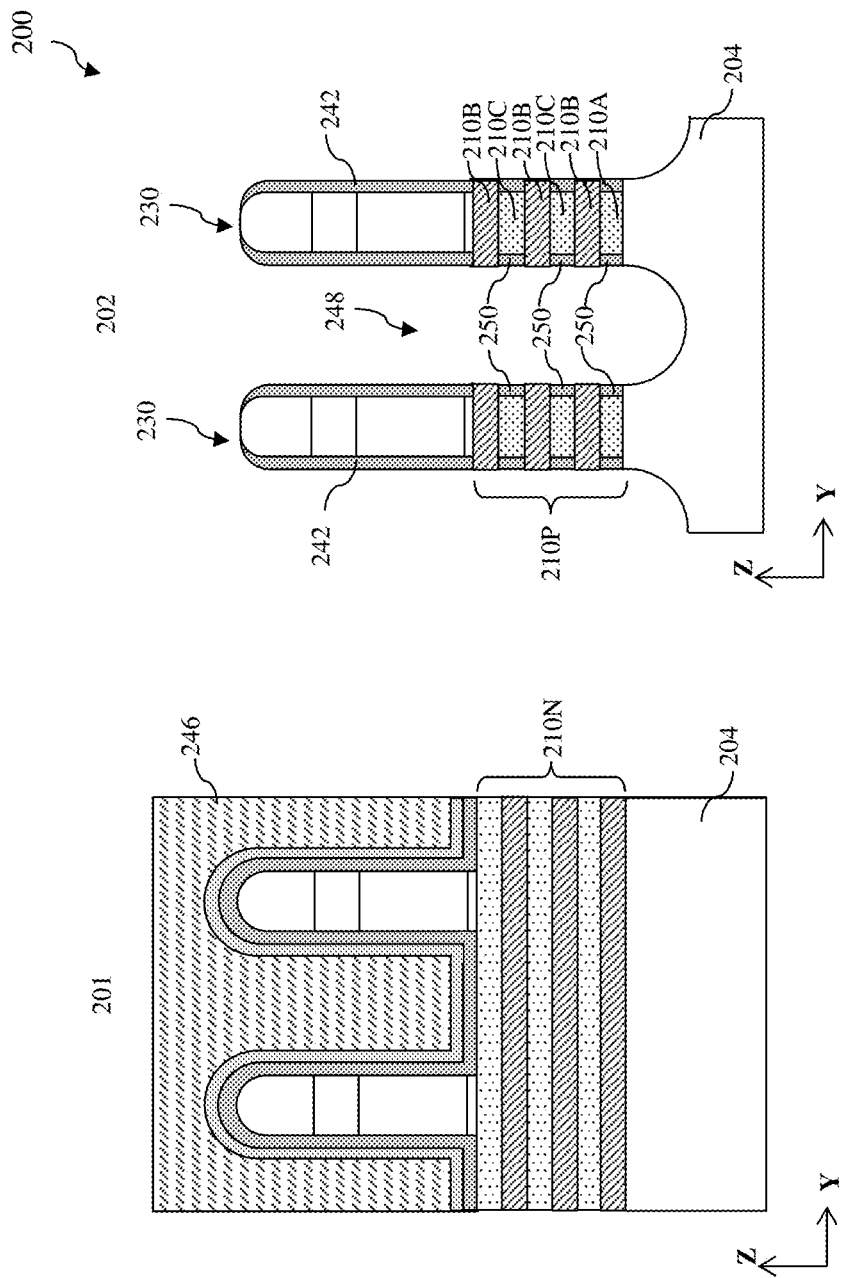

Now referring to FIGS. 24 and 28A, 28B, at operation 2420, inner spacers 250 are formed in the semiconductor layer structure 210P. The inner spacers 250 are formed along the sidewalls of the semiconductor layers 210A and 210C and between the semiconductor layers 210B the semiconductor layer structure 210P. First, the portions (edges) of the semiconductor layers 210A and 210C exposed in the S/D trenches 248 are selectively removed by a suitable etching process to form gaps between adjacent semiconductor layers 210B. As discussed above, in the depicted embodiment, semiconductor layers 210A and 210C include Si and semiconductor layers 210B include SiGe. Accordingly, the etching process can selectively remove the exposed portions of the Si layers 210A and 210C without removing or substantially removing the SiGe layers 210B. In some embodiments, the etching process is a selective etching process (e.g., a selective dry etching process or a selective wet etching process), and the extent of which the semiconductor layers 210A and 210C is removed is controlled by the duration of the etching process. In some embodiments, the selective wet etching process may include an etchant such as ammonia ($NH_3$), fluorine ($F_2$), or a combination thereof. In the depicted embodiment, the selective removal of the Si layers 210A and 210C may include an oxidation process followed by a SiOx removal. For example, the oxidation process may include forming and patterning various masking layers such that the oxidation is controlled to the Si layers. In some other embodiments, the oxidation process is a selective oxidation due to the different compositions of the semiconductor layers 210A/210C and the semiconductor layers 210B. In some embodiments, the oxidation process may be performed by exposing the PFET area 202 to a wet oxidation process, a dry oxidation process, or a combination thereof. Thereafter, the oxidized semiconductor layers, which include SiOx, are removed by an etchant such as $NH_3$, $F_2$, or a combination thereof.

After the selective etching process, edges of the semiconductor layers 210B are suspended in the S/D trenches 248. Subsequently, the inner spacers 250 are formed to fill in the gaps between the adjacent semiconductor layers 210B. In some embodiments, the inner spacers 250 comprise a dielectric material that is similar to the material of the gate spacers 242, such as $SiO_2$, $Si_3N_4$, SiON, SiC, or combinations thereof. The dielectric material of the inner spacers 250 may be deposited in the S/D trenches 248 and in the gaps between the semiconductor layers 210B by CVD, PVD, ALD, or combinations thereof. Extra dielectric material is removed along sidewalls of the gate spacers 242 until the sidewalls of the semiconductor layers 210B are exposed in the S/D trenches 248, thereby to form the inner spacers 250.

Now referring to FIGS. 24 and 29A, 29B, at operation 2425, epitaxial S/D features 252 are formed in the S/D trenches 248 in the PFET area 202. In some embodiments, the epitaxial S/D features 252 may include a semiconductor material such as silicon (Si) or germanium (Ge); a compound semiconductor such as silicon germanium (SiGe), silicon carbide (SiC), gallium arsenide (GaAs), etc.; an alloy semiconductor; or combinations thereof. An epitaxy process may be implemented to epitaxially grow S/D features 252. The epitaxy process may include CVD deposition (for example, vapor-phase epitaxy (VPE), ultra-high vacuum CVD (UHV-CVD), low-pressure CVD (LPCVD), and/or plasma-enhanced (PECVD)), molecular beam epitaxy (MBE), other suitable selective epitaxial growth (SEG) processes, or combinations thereof. Epitaxial S/D features 252 may be doped with p-type dopants, such as boron (B, $^{11}$B or BF2), gallium (Ga), or combinations thereof, for the PFET. In some embodiments, epitaxial S/D features 252 may include multiple epitaxial semiconductor layers, and different epitaxial semiconductor layers are different in amount of the dopant included therein.

Figures 30A, 30B:
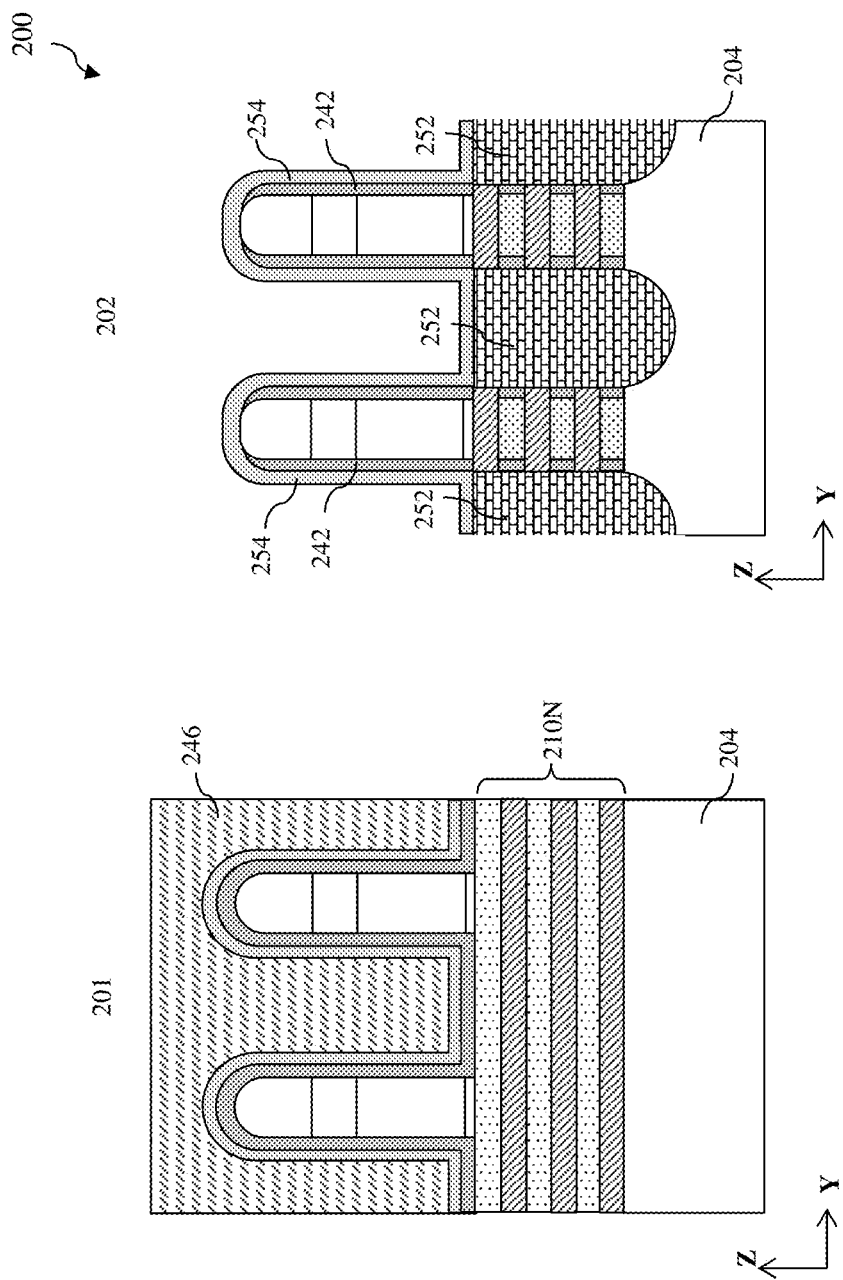

Now referring to FIGS. 24 and 30A, 30B, at operation 2430, a protection layer 254 is formed over the dummy gate 230, the gate spacers 242, and the epitaxial S/D features 252 in the PFET area 202. In some embodiments, the protection layer 254 includes a dielectric material including nitrogen, such as $Si_3N_4$, SiON, SiOCN, or combinations thereof, to protect the components in the PFET area 202, including the dummy gate stacks 230, the gate spacers 242, and the epitaxial S/D features 252 from being oxidized in the air. The protection layer 254 may be deposited by ALD, CVD, other depositing process, or combinations thereof. Thereafter, the hard mask 246 coving the NFET area 201 is removed by a suitable etching process, including dry etch, wet etch, or combinations thereof.

Thereafter, according to FIG. 24, at operations 2435 to 2450, similar processes are applied to the components in the NFET area 201, while the PFET area 202 is protected by a hard mask.

Figure 31B:
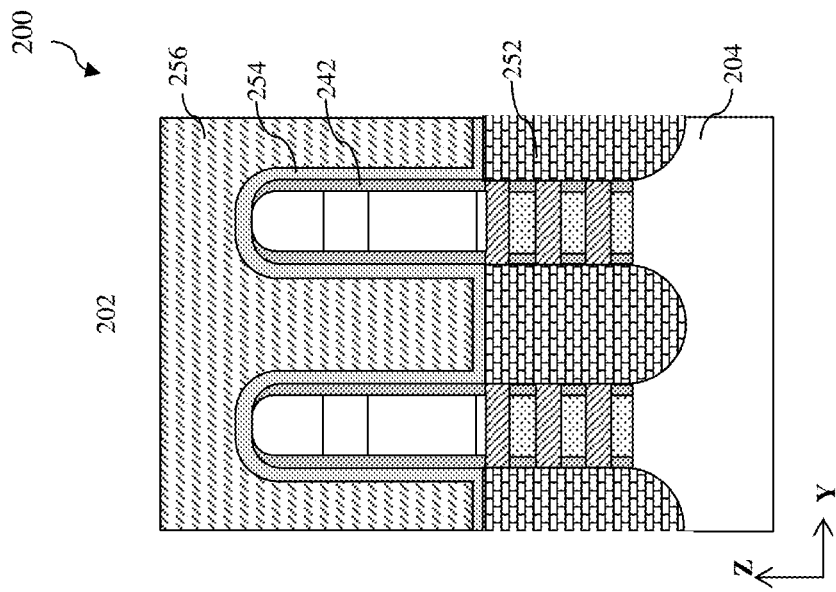
Figure 31A:
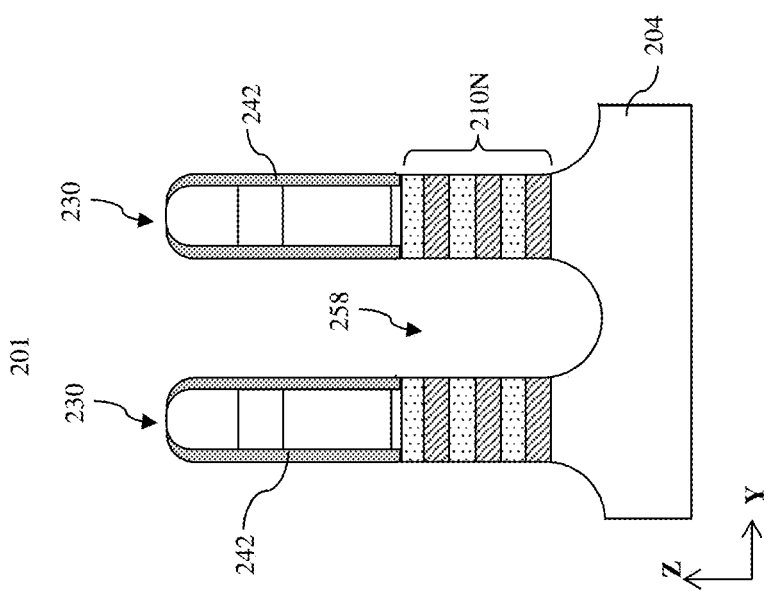

For example, referring to FIGS. 24 and 31A, 31B, at operation 2435, the S/D trenches are formed in the NFET area 201, while the PFET area 202 is protected. As depicted in FIGS. 27A and 27B, first, a hard mask 256 is deposited in the PFET area 202 to protect the components thereof. Thereafter, a suitable etching process, such as a dry etching process, a wet etching process, or combinations thereof, is performed along sidewalls of the spacer layers 240 to the portions of the semiconductor layer structure 210N in the S/D regions. Thereby, the S/D trenches 258 are formed and the sidewalls of the alternating semiconductor layers 210B and 210C of the semiconductor layer structure 210N are exposed in the trenches 258. The second spacer layers 244 and the top portions of the first spacer layers 242 may also be removed when forming the S/D trenches 258. And, the remained portions of the first spacer layers 242 form the gate spacers. The portions of the semiconductor layer structure 210N under the gate spacers 242 and the gate stacks 230 remain substantially unchanged.

Figures 32A, 32B:
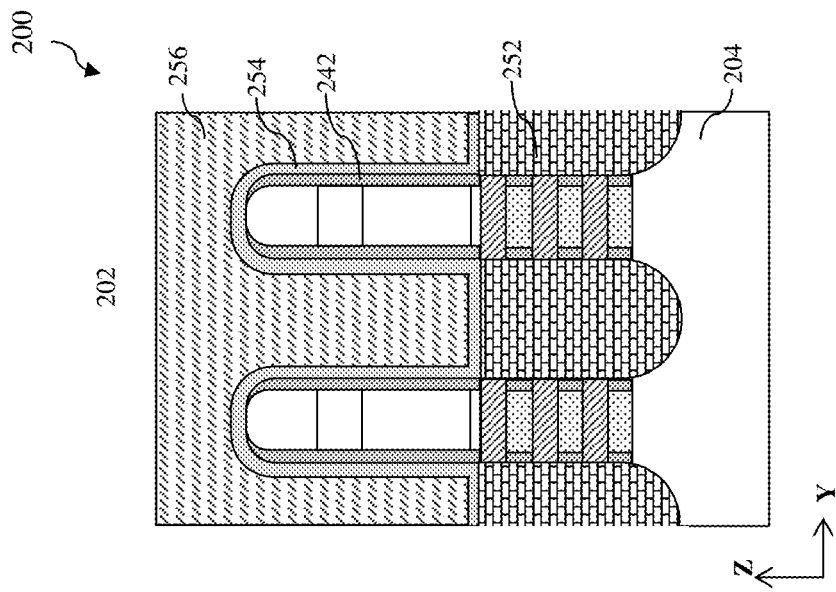

Now referring to FIGS. 24 and 32A, 32B, at operation 2440, inner spacers 250 are formed in the NFET area 201. The inner spacers 250 are formed by various processes similar as those formed in the PFET area 202. For example, first, the portions (edges) of the semiconductor layers 210B exposed in the S/D trenches 258 are selectively removed by a suitable etching process to form gaps between adjacent semiconductor layers 210C. In the depicted embodiment, the etching process selectively removes portions of the SiGe layers 210B without removing or substantially removing the Si layers 210C. In some embodiments, the etching process is a selective etching process (e.g., a selective dry etching process or a selective wet etching process), and the extent of which semiconductor layer 210B is removed is controlled by duration of the etching process. In some embodiments, the selective wet etching process may include an etchant such as hydrogen fluoride (HF), fluorine ($F_2$), or combinations thereof. In the depicted embodiment, the selective removal of the SiGe layers 210B may include an oxidation process followed by a SiGeOx removal. For example, the oxidation process may include forming and patterning various masking layers such that the oxidation is controlled to the SiGe layers. In some other embodiments, the oxidation process is a selective oxidation due to the different compositions of the semiconductor layers 210B and the semiconductor layers 210C. In some embodiments, the oxidation process may be performed by exposing the NFET area 201 to a wet oxidation process, a dry oxidation process, or a combination thereof. Thereafter, the oxidized semiconductor layers, which include SiGeOx, are removed by an etchant such as diluted HF, $F_2$, or a combination thereof.

After the selective etching process, edges of the semiconductor layers 210C are suspended in the S/D trenches 258. Subsequently, the inner spacers 250 are formed to fill in the gaps between the adjacent semiconductor layers 210C. In some embodiments, the inner spacers 250 comprise a dielectric material such as $SiO_2$, $Si_3N_4$, SiON, SiC, or combinations thereof. The dielectric material of the inner spacers 250 may be deposited in the S/D trenches 258 and in the gaps between the semiconductor layers 210C by CVD, PVD, ALD, or combinations thereof. Extra dielectric material is removed along sidewalls of the gate spacers 242 until the sidewalls of the semiconductor layers 210C are exposed in the S/D trenches 258.

Figure 33B:
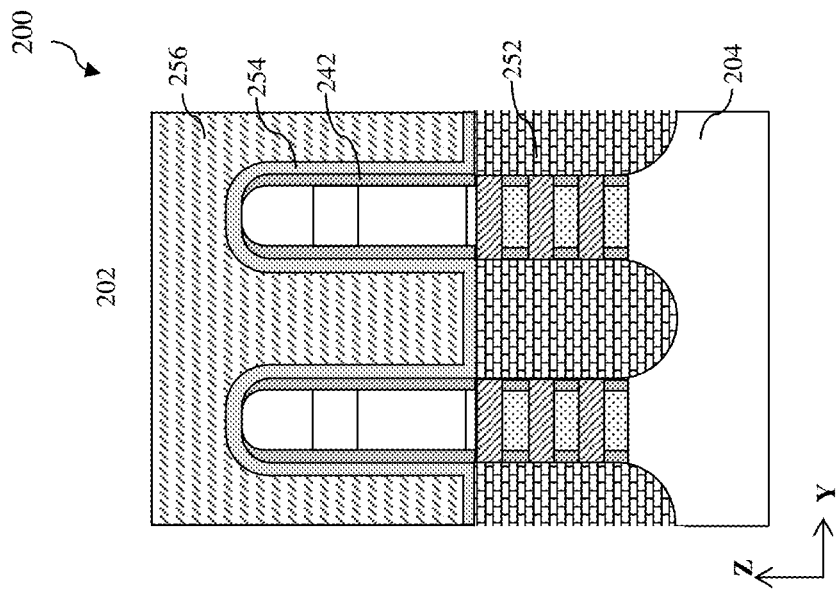
Figure 33A:
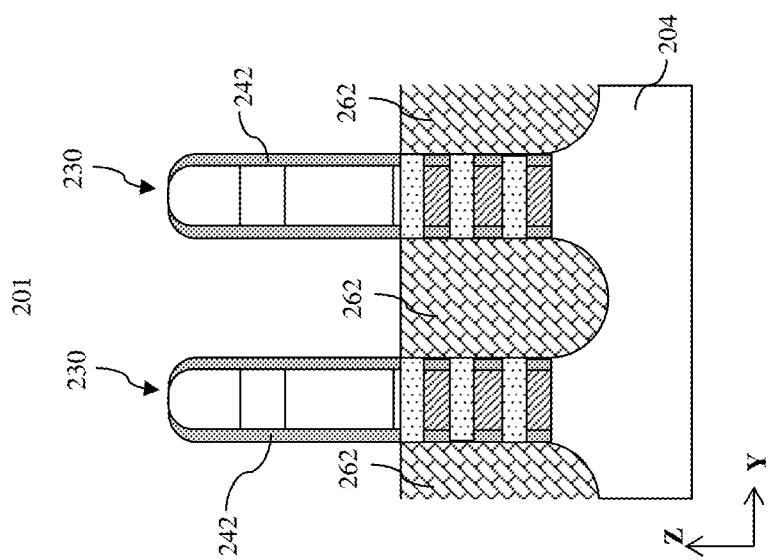

Now referring to FIGS. 24 and 33A, 33B, at operation 2445, epitaxial S/D features 262 are formed in the S/D trenches 258 in the NFET area 201. In some embodiments, a material of the epitaxial S/D features 262 is similar as the material of the epitaxial S/D features 252. An epitaxy process (including CVD, MBE, other SEG processes, or combinations thereof) may be implemented to epitaxially grow S/D features 262. Epitaxial S/D features 262 may be doped with n-type dopants, such as phosphorus (P, 31P), arsenic (As), or combinations thereof, for the NFET. In some embodiments, epitaxial S/D features 262 may include multiple epitaxial semiconductor layers, and different epitaxial semiconductor layers are different in amount of the dopant included therein.

Figure 34B:
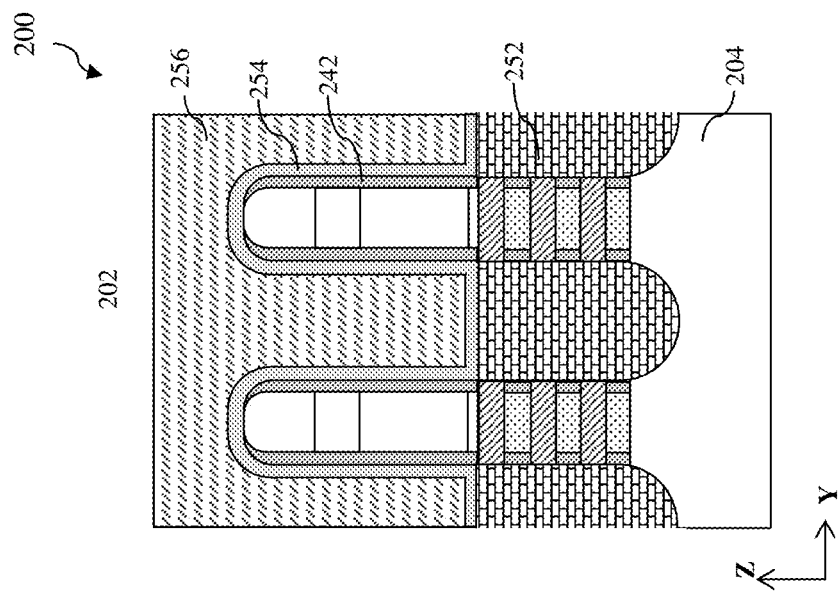
Figure 34A:
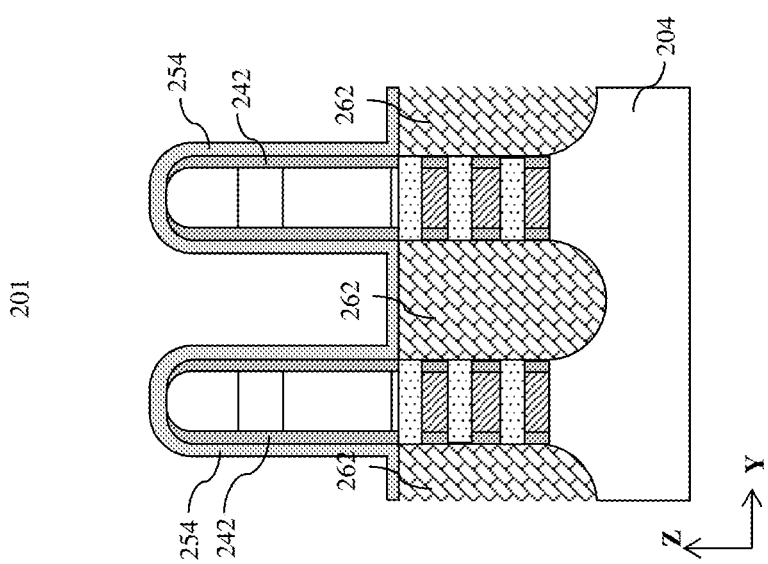

Now referring to FIGS. 24 and 34A, 34B, at operation 2450, a protection layer 254 is formed over the dummy gates 230, the gate spacers 242, and the epitaxial S/D features 262 in the NEFET area 201. The material and the formation process of the protection layer 254 in the NFET area 201 is similar as that formed in the PFET area 202. Thereafter, the hard mask 256 coving the NFET area 201 is removed by a suitable etching process, including dry etch, wet etch, or combinations thereof.

Thereafter, a gate replacement process is performed to replace the dummy gate stacks 230 with respective metal gate stacks 270. The gate replacement process may be implemented in a series of fabrication steps as described below.

Figures 35A, 35B:
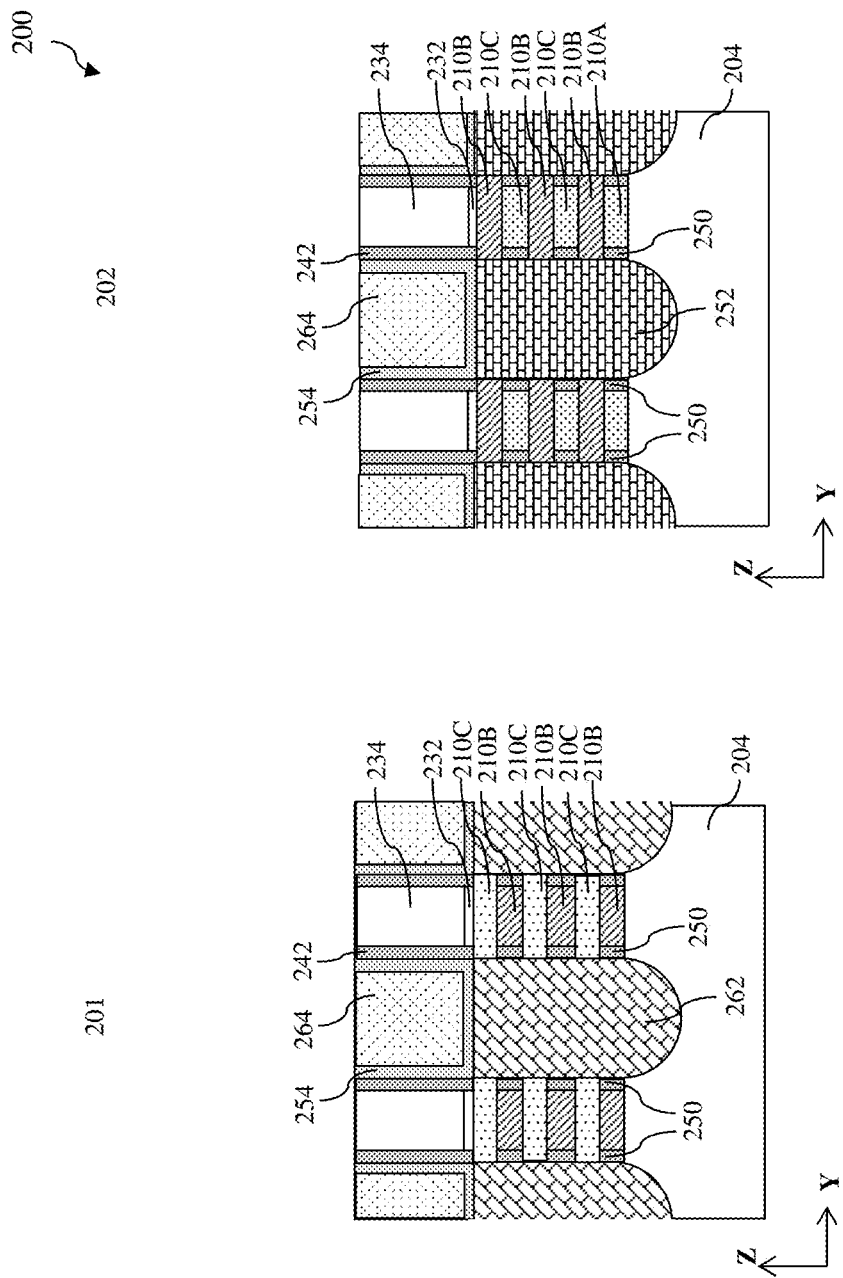

Referring to FIGS. 24, 35A, 35B and 36A, 36B, at operation 2455, dummy gate stacks 230 are removed to form gate trenches 266 in the NFET area 201 and the PFET area 202. Referring to FIGS. 35A and 35B, first, an interlayer dielectric (ILD) layer 264 is deposited over the device 200. The ILD layer 264 includes a low-k dielectric material, such as tetraethylorthosilicate (TEOS), un-doped silicate glass, or doped silicon oxide such as borophosphosilicate glass (BPSG), fused silica glass (FSG), phosphosilicate glass (PSG), boron doped silicon glass (BSG), other suitable dielectric materials, or combinations thereof. In some embodiments, the ILD layer 264 may include a multi-layer structure having multiple dielectric materials. In some embodiments, the material(s) of the ILD layer 264 is deposited over the protection layers 254 in the NFET area 201 and the PFET area 202 by any suitable process, such as flowable CVD (FCVD), spin-on-glass (SOG), other suitable methods, or combinations thereof. Thereafter, a planarization process, such as a CMP process, is applied to the device 200 to planarize a top surface of device 200 and expose the dummy gate electrode 234. As depicted in FIGS. 35A and 35B, the planarization process may also remove the first dummy gate hard mask layers 236 and the second dummy gate hard mask layers 238. As a result, the dummy gate electrodes 234 are exposed from a top surface of the device 200. In some embodiments, an etch stop layer (ESL, not shown) including dielectric material(s) (such as $SiO_2$, SiON, $Si_3N_4$, SiCN, SiOC, and/or SiOCN) may be deposited between the ILD layer 264 and the protection layer 254.

Thereafter, referring to FIGS. 36A and 36B, the dummy gate electrodes 234 are removed to expose the channel regions of the semiconductor layer structures 210N and 210P. The interfacial layer 232 is also removed at operation 2455. Thereby, the gate trenches 266 are formed and the channel regions of the semiconductor layer structures 210N and 210P are exposed in the gate trenches 266. In some embodiments, removing the dummy gate electrodes 234 and the interfacial layers 232 includes one or more etching processes, such as wet etching, dry etching, reactive-ion etching (RIE), other etching techniques, or combinations thereof.

Figures 37A, 37B:
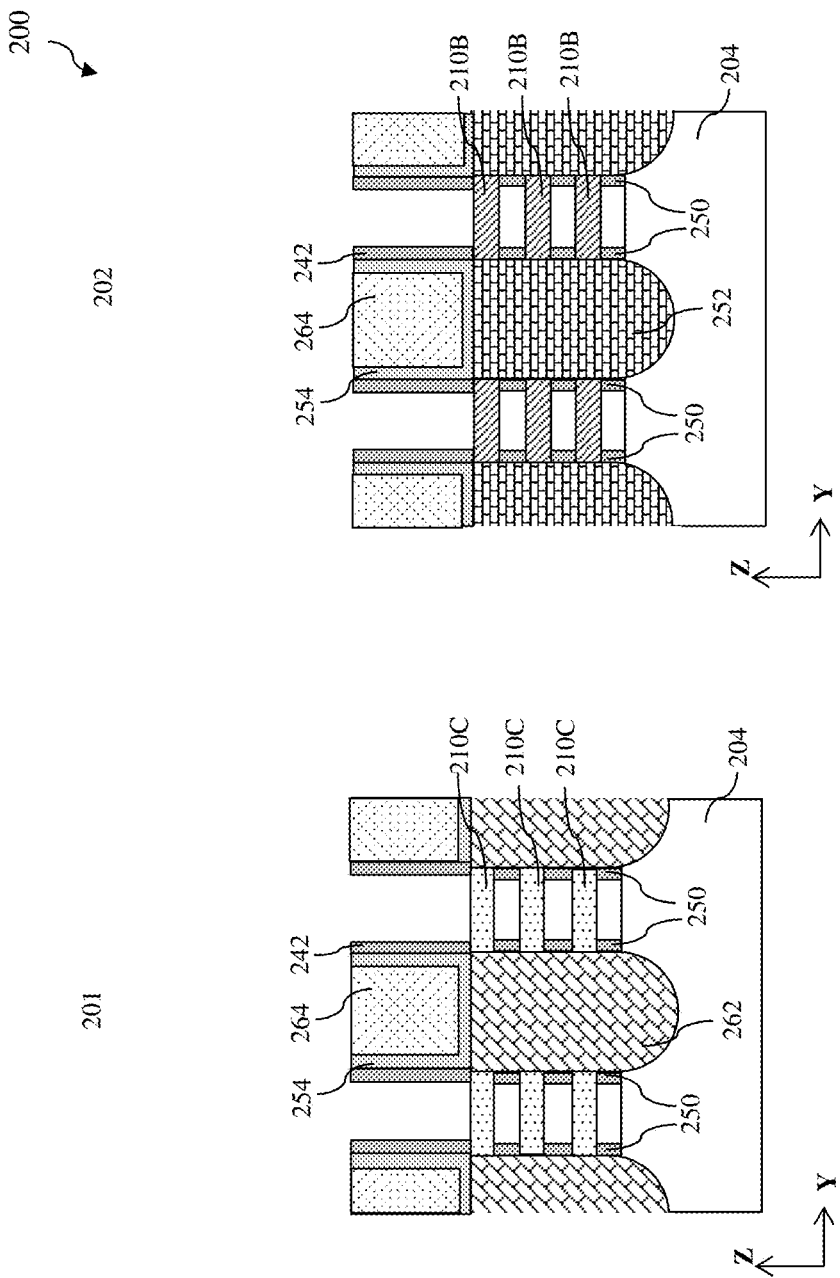
Figures 38A, 38B:
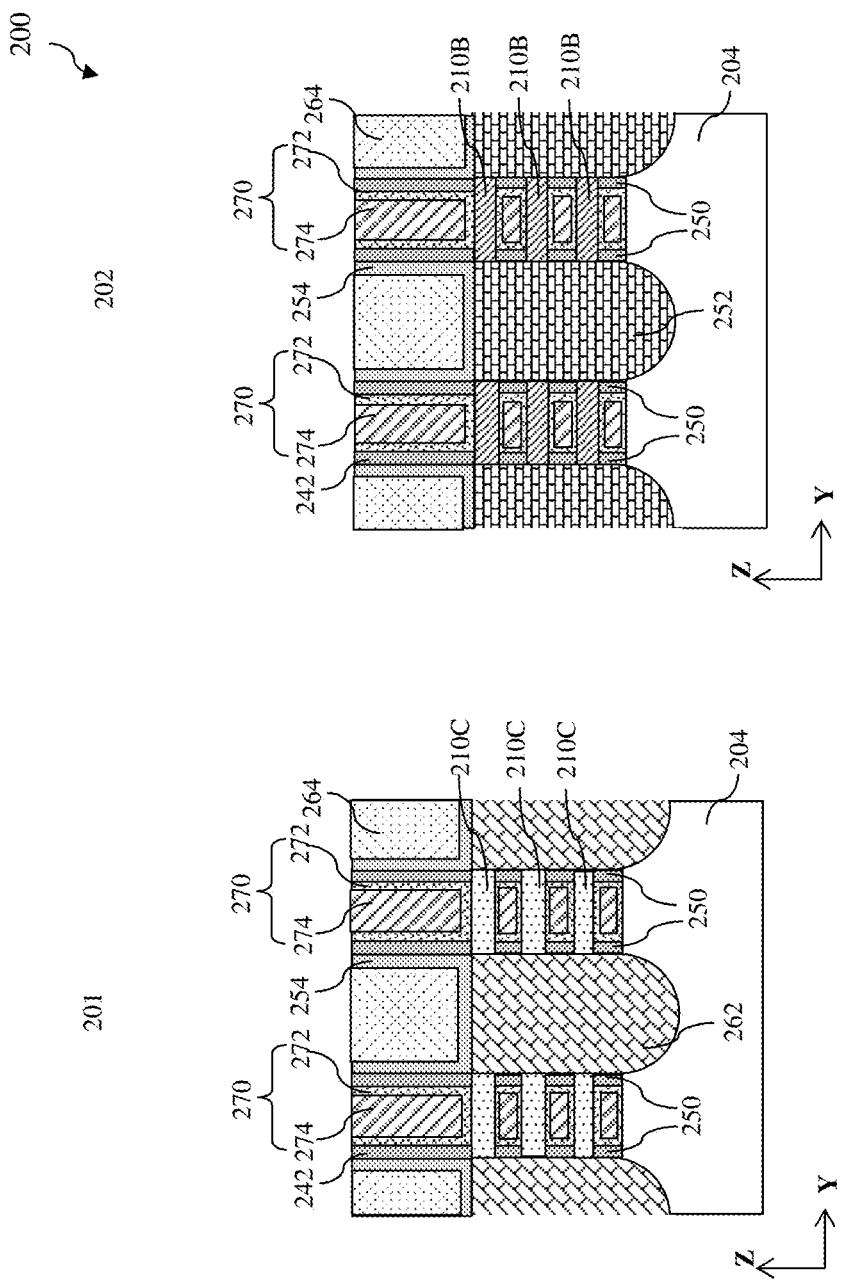

Now referring to FIGS. 24, and 37A, 37B, at operation 2460, channel release processes are performed in the NFET area 201 and the PFET area 202, such that the semiconductor layers 210B (for example, including SiGe) of the n-type semiconductor layer structure 210N and the semiconductor layers 210A and 210C (for example, including Si) of the p-type semiconductor layer structure 210P are removed from the gate trenches 266. As a result, the semiconductor layers 210C (for example, including Si) are suspended in the channel regions of the n-type semiconductor layer structure 210N, and the semiconductor layers 210B (for example, including SiGe) are suspended in the channel regions of the p-type semiconductor layer structure 210P. Both the suspended semiconductor layers 210C of the n-type semiconductor layer structure 210N and the suspended semiconductor layers 210B of the p-type semiconductor layer structure 210P are referred to as the channel semiconductor layers of the semiconductor layer structures 210P and 210N. As depicted in FIGS. 38A and 38B, the transistors in the NFET area 201 comprise the Si channel semiconductor layers 210C, and the transistors in the PFET area 201 comprise the SiGe channel semiconductor layers 210B.

The semiconductor layers 210A and 210C in the PFET area 202 and the semiconductor layers 210B in the NFET area 201 may be removed by the channel release processes in different orders. In some embodiments, first, the NFET area 201 is covered by a hard mask and the channel release process is performed in the PFET area 202. Subsequently, the PFET area 202 is covered by a hard mask and the channel released process is performed in NFET area 201. In some other embodiments, the PFET area 202 is first covered by a hard mask and the channel release process is performed in the NFET area 201. Subsequently, the NFET area 201 is covered by a hard mask and the channel released process is performed in the PFET area 202. In the depicted embodiment, for example, first, the NFET area 201 is covered by a hard mask. A selective etching process is applied to the exposed portions of the p-type semiconductor layer structure 210P in the PFET area 202, such that the semiconductor layers 210A and 210C (the Si layers) of the p-type semiconductor layer structure 210P are selectively removed, while the semiconductor layers 210B (the SiGe layers) remain substantially unchanged. The selective etching may be a selective wet etching, a selective dry etching, or a combination thereof. In some embodiments, the selective wet etching process may include an etchant such as $NH_3$, $F_2$, or a combination thereof. And extent of the selective removing of the silicon semiconductor layers can be controlled by the amount of the etchant, such that the substrate 204 (also comprising Si) may not be substantially etched or may be etched by an acceptable extent when the Si layers 210A and 210C are selectively removed. In some embodiments, the selective removal of semiconductor layers 210A and 210C may include an Si oxidation process followed by a SiOx removal. Thereafter, the hard mask covering the NFET area 201 is removed and the PFET area 202 is covered by a hard mask. A selective etching process is then applied to the exposed portions of the n-type semiconductor layer structure 210N in the NFET area 201, such that the semiconductor layers 210B (the SiGe layers) of the n-type semiconductor layer structure 210N are selectively removed while the semiconductor layers 210C (the Si layers) remain substantially unchanged. The selective etching may be a selective wet etching, a selective dry etching, or a combination thereof. In some embodiments, the selective wet etching process may include an etchant such as HF, $F_2$, or a combination thereof. In some embodiments, the selective removal of semiconductor layers 210B may include an SiGe oxidation process followed by a SiGeOx removal. Since the substrate 204 includes different material than the SiGe semiconductor layers 210B, the substrate 204 is not substantially affected when removing the SiGe semiconductor layers 210B. Thereafter, the hard mask covering the PFET area 202 is removed.

Referring to FIGS. 37A and 37B, the channel semiconductor layers 210C in the NFET area 201 are Si layers and the channel semiconductor layers 210B in the PFET area 202 are SiGe layers. In the depicted embodiment, the channel semiconductor layers 210C in the NFET area 201 or the channel semiconductor layers 210B in the PFET area 202 are separated from each other and stacked up along a direction (z-direction) generally perpendicular to a top surface of the substrate 204 (X-Y plane). The adjacent channel semiconductor layers (for example, the Si channel layers 210C in the NFET area 201 or the SiGe channel layers 210B in the PFET area 202) are separated and supported by the inner spacer 250 formed therebetween. In some embodiments, the channel semiconductor layers are slightly etched or not etched during the channel release processes. Further, the channel semiconductor layers may be of any suitable shapes, such as a wire-like shape, a sheet-like shape, or other geometrical shape (for other stack structure GAA transistors).

Compare with a conventional CMOS GAA device where the materials of the channel semiconductor layers for both the p-type GAA transistor and the n-type GAA transistor are the same (for example, both includes Si), the CMOS GAA device in the present disclosure provides different materials for the channel layers of the p-type and n-type GAA transistors. For example, p-type GAA transistor includes SiGe channels and n-type GAA transistor includes Si channels. Therefore, the device gain of the p-type GAA transistor (with the SiGe channels) can be improved, and thereby the performance of the CMOS GAA device can be improved. The fabrication processes of the different channel layers for the p-type GAA transistors and for the n-type GAA are integrated, thereby a flexible layout footprint design is provided.

Now referring to FIGS. 1, 38A and 38B, at operation 2465, metal gate stacks 270 are formed over the channel regions in the NFET area 201 and the PFET area 202. The metal gate stacks 270 fills the gate trenches 266 and wraps around each of channel semiconductor layers (for example, Si channel layers 210C in the NFET area 201 and SiGe channel layers 210B in the PFET area 202). Each of the metal gate stacks 270 may include multiple layers, such as a gate dielectric layer 272 wrapping each of the channel semiconductor layers, and a gate electrode 274 including a work function metal layer formed over the gate dielectric layer 272, a bulk conductive layer formed over the work function metal layer, other suitable layers, or combinations thereof. The gate dielectric layer 272 may be a high-k dielectric layer and includes one or more high-k dielectric materials (or one or more layers of high-k dielectric materials), such as hafnium silicon oxide (HfSiO), hafnium oxide ($HfO_2$), alumina ($Al_2O_3$), zirconium oxide ($ZrO_2$), lanthanum oxide ($La_2O_3$), titanium oxide ($TiO_2$), yttrium oxide ($Y_2O_3$), strontium titanate ($SrTiO_3$), or a combination thereof. The work function metal layer of the gate electrode 274 may include any suitable material, such as titanium nitride (TiN), tantalum nitride (TaN), ruthenium (Ru), molybdenum (Mo), tungsten (W), platinum (Pt), titanium (Ti), aluminum (Al), tantalum carbide (TaC), tantalum carbide nitride (TaCN), tantalum silicon nitride (TaSiN), titanium silicon nitride (TiSiN), other suitable materials, or combinations thereof. In some embodiments, the work function metal layer includes multiple material layers of the same or different types (i.e., both n-type work function metal or both p-type work function metal) in order to achieve a desired threshold voltage. The bulk conductive layer may include aluminum (Al), copper (Cu), tungsten (W), cobalt (Co), ruthenium (Ru), other suitable conductive materials, or combinations thereof. The metal gate stacks 270 may include other material layers, such as a barrier layer, a glue layer, a hard mask layer, and/or a capping layer. The various layers of the metal gate stacks 270 may be formed by any suitable method, such as CVD, ALD, PVD, plating, chemical oxidation, thermal oxidation, other suitable methods, or combinations thereof. Thereafter, a polishing process (for example, a CMP process) is performed to remove any excess conductive materials and planarize the top surface of the device 200.

Figures 39A, 39B:
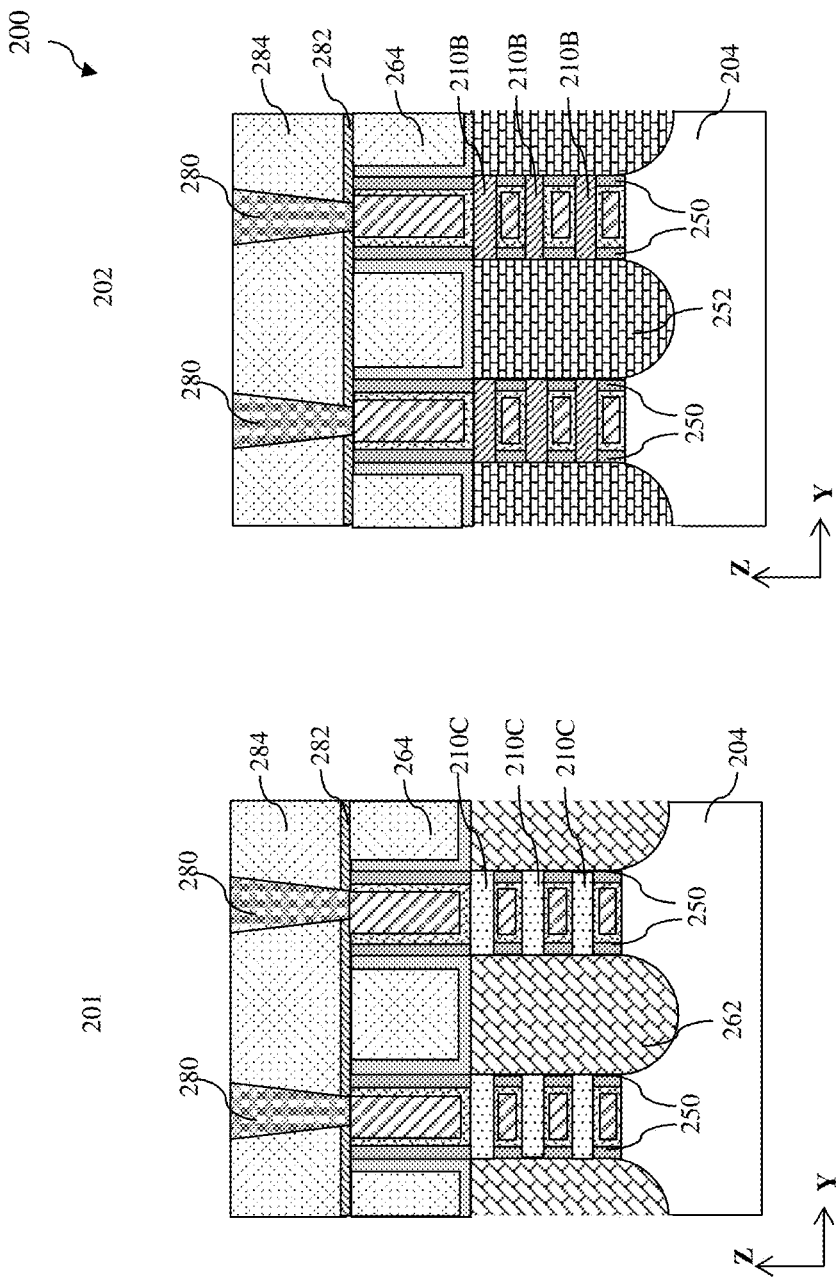

Now referring to FIGS. 24, and 39A, 39B, at operation 2470, further processes are performed to complete the fabrication of the device 200. For example, it may form various contacts/vias 280, wires, and multilayer interconnect features (e.g., metal layers and interlayer dielectric layers such as ESL 282 and ILD layer 284) over the device 200, configured to connect the various features to form a functional circuit that may include one or more GAA devices.

Although not intended to be limiting, one or more embodiments of the present disclosure provide many benefits to a semiconductor device and a formation process thereof. For example, embodiments of the present disclosure provide a CMOS GAA device including different types (n-type and p-type) of GAA transistors, and the materials of the channel layers of the different types of GAA transistors are different. For example, the CMOS GAA device includes a p-type GAA transistor with SiGe channels and a n-type GAA transistor with Si channels. The performance of the p-type GAA transistor having SiGe channels has better mobility and transconductance and less parasitic resistance compare with a p-type GAA transistor having Si channels. Therefore, the performance of the CMOS GAA device is also improved. The fabrication can be integrated with the current processes and can be applied to multiple technology generations.

The present disclosure provides for many different embodiments. Semiconductor device having trimmed channel and dipoled dielectric layer and methods of fabrication thereof are disclosed herein. An exemplary method comprises forming a first semiconductor layer including a first semiconductor material in a first area of a substrate; alternately depositing second semiconductor layers and third semiconductor layers over the first semiconductor layer and over the substrate to form a semiconductor layer stack including the first semiconductor layer, the second semiconductor layers, and the third semiconductor layers, wherein the second semiconductor layers include a second semiconductor material, the third semiconductor layers include the first semiconductor material, the second semiconductor material is different from the first semiconductor material, and a bottom surface of one of the second semiconductor layers contacts the first semiconductor layer in the first area and contacts the substrate in a second area of the substrate; planarizing a top surface of the semiconductor layer stack; and patterning the semiconductor layer stack to form a first semiconductor structure in the first area and a second semiconductor structure in the second area.

In some embodiments, the semiconductor layer stack comprises a boundary portion between the first area and the second area, wherein the second semiconductor layers and the third semiconductor layers are formed to have steps in the boundary portion.

In some embodiments, the exemplary method further comprises forming a buffer layer over the semiconductor layer stack before the planarizing of the top surface of the semiconductor layer stack, wherein the buffer layer includes the first semiconductor material, and the planarizing of the top surface of the semiconductor layer stack includes planarizing a top surface of the buffer layer. In some embodiments, the planarizing of the top surface of the semiconductor layer stack includes removing the buffer layer and a portion of a topmost one of the third semiconductor layers in the first area and removing a portion of the buffer layer in the second area. In some embodiments, a thickness of the buffer layer is about 1.5 to about 5 times of a thickness of one of the third semiconductor layers.

In some embodiments, the exemplary method further comprises forming a first source/drain (S/D) trench in the first area; and epitaxially growing a first S/D feature including a third semiconductor material in the first area. In some embodiments, the exemplary method further comprises forming a second S/D trench in the second area; and epitaxially growing a second S/D feature including a fourth semiconductor material in the second area, wherein the fourth semiconductor material is different from the third semiconductor material. In some embodiments, the exemplary method further comprises selectively removing the first semiconductor layer and the third semiconductor layers in the first area while keeping the second semiconductor layers in the first area; and selectively removing the second semiconductor layers in the second area while keeping the third semiconductor layers in the second area.

Another exemplary method comprises forming a first semiconductor layer including a first semiconductor material in a first area of a substrate; forming a dummy spacer between the first area and a second area of the substrate; alternately depositing one or more second semiconductor layers including a second semiconductor material and one or more third semiconductor layers including the first semiconductor material over the first semiconductor layer in the first area to form a first semiconductor layer stack and over the substrate in the second area to form a second semiconductor layer stack, wherein the second semiconductor material is different from the first semiconductor material; planarizing a top surface of the first semiconductor layer stack and a top surface of the second semiconductor layer stack; etching the first semiconductor layer stack to form a first semiconductor structure in the first area; and etching the second semiconductor layer stack to form a second semiconductor structure in the second area.

In some embodiments, forming the dummy spacer includes depositing a dummy spacer layer over the substrate and the first semiconductor layer; and anisotropically etching the dummy spacer layer to form the dummy spacer. In some embodiments, a height of the dummy spacer is higher than a height of the first semiconductor layer stack and a height of the second semiconductor layer stack. In some embodiments, a height to width ratio of the dummy spacer is about 6 to about 12. In some embodiments, the dummy spacer includes SiO2 or SnO2.

In some embodiments, the other exemplary method further comprising depositing a buffer layer including the first semiconductor material over the first semiconductor layer stack and the second semiconductor layer stack before planarizing the top surface of the first semiconductor layer stack and the top surface of the second semiconductor layer stack.

An exemplary semiconductor device includes a substrate; first semiconductor layers over a first area of the substrate, wherein the first semiconductor layers are separated from each other and are stacked up along a direction generally perpendicular to a top surface of the substrate; second semiconductor layers over a second area of the substrate, wherein the second semiconductor layers are separated from each other and are stacked up along the direction generally perpendicular to the top surface of the substrate, wherein the first semiconductor layers include a first semiconductor material, and the second semiconductor layers include a second semiconductor material different from the first semiconductor material; a first metal gate structure wrapping around each of the first semiconductor layers; and a second metal gate structure wrapping around each of the second semiconductor layers.

In some embodiments, the first semiconductor material is silicon (Si) and the first area is an n-type device area, and the second semiconductor material is silicon germanium (SiGe) and the second area is a p-type device area.

In some embodiments, the exemplary semiconductor device further comprises a first source/drain (S/D) feature contacting sidewalls of the first semiconductor layers; and a second S/D feature contacting sidewalls of the second semiconductor layers, wherein a material of the second S/D feature is different from a material of the first S/D feature.

In some embodiments, the exemplary semiconductor device further comprises first inner spacers vertically between the adjacent first semiconductor layers; and second inner spacers vertically between the adjacent second semiconductor layers.

In some embodiments, the exemplary semiconductor device further comprises gate spacers over the first semiconductor layers and over the second semiconductor layers.

In some embodiments, each of the first metal gate structures includes a first gate dielectric layer wrapping around the first semiconductor layers and a first gate electrode over the first gate dielectric layer; and each of the second metal gate structures includes a second gate dielectric layer wrapping around the second semiconductor layers and a second gate electrode over the second gate dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
    first semiconductor layers disposed over a first area of a substrate, wherein the first semiconductor layers are separated from each other and are stacked up along a direction generally perpendicular to a top surface of the substrate, wherein one of the first semiconductor layers has a top surface facing away from the substrate and positioned at a first height above the substrate;
    second semiconductor layers disposed over a second area of the substrate, wherein the second semiconductor layers are separated from each other and are stacked up along the direction generally perpendicular to the top surface of the substrate, wherein the first semiconductor layers include a first semiconductor material, and the second semiconductor layers include a second semiconductor material different from the first semiconductor material, wherein one of the second semiconductor layers has a top surface facing away from the substrate and positioned at the first height above the substrate;
    a first gate structure wrapping around each of the first semiconductor layers; and
    a second gate structure wrapping around each of the second semiconductor layers.

2. The device of claim 1, wherein the one of the first semiconductor layers is a topmost first semiconductor layer from the first semiconductor layers.

3. The device of claim 1, wherein the one of the first semiconductor layers is a bottommost first semiconductor layer form the first semiconductor layers, and wherein the one of the second semiconductor layers is a bottommost second semiconductor layer from the second semiconductor layers.

4. The device of claim 1, wherein the first semiconductor material includes silicon and the second semiconductor material includes germanium.

5. The device of claim 1, wherein the number of first semiconductor layers is equal to the number of second semiconductor layers.

6. The device of claim 1, further comprising a sidewall spacer extending from the one of the first semiconductor layers to the first area of the substrate.

7. The device of claim 1, further comprising:
    a first source/drain feature interfacing with the one of the first semiconductor layers; and
    a second source/drain feature interfacing with the one of the second semiconductor layers.

8. The device of claim 1, wherein the first gate structure wrapping around each of the first semiconductor layers incudes a first high-k dielectric layer and a first conductive material layer, and
    wherein the second gate structure wrapping around each of the second semiconductor layers incudes a second high-k dielectric layer and a second conductive material layer.

9. A device comprising:
    first semiconductor layers disposed over a substrate, wherein the first semiconductor layers are separated from each other and are stacked up along a direction generally perpendicular to a top surface of the substrate, wherein a topmost first semiconductor layer from the first semiconductor layers extends to a first height above the substrate;
    second semiconductor layers disposed over the substrate, wherein the second semiconductor layers are separated from each other and are stacked up along the direction generally perpendicular to the top surface of the substrate, wherein a topmost second semiconductor layer from the second semiconductor layers extends to the first height above the substrate, the topmost second semiconductor layer having a different material composition than the topmost first semiconductor layer;
    a first gate structure wrapping around each of the first semiconductor layers; and
    a second gate structure wrapping around each of the second semiconductor layers.

10. The device of claim 9, wherein all of the first semiconductor layers are formed of a first material composition, and
    wherein all of the second semiconductor layers are formed of a second material composition that is different than the first material composition.

11. The device of claim 9, wherein the topmost first semiconductor layer includes silicon and the second topmost semiconductor layer includes germanium.

12. The device of claim 9, wherein the first semiconductor layers are part of a n-type transistor and the second semiconductor layer are part of a p-type transistor.

13. The device of claim 9, wherein a first portion of the substrate directly under the first semiconductor layers extends to a second height, and
    wherein a second portion of the substrate directly under the second semiconductor layers extends to the second height.

14. The device of claim 13, further comprising:
a first sidewall spacer extending from the first portion of the substrate to a bottommost first semiconductor layer from the first semiconductor layers; and
a second sidewall spacer extending from the second portion of the substrate to a bottommost second semiconductor layer from the second semiconductor layers, and
wherein the bottommost first semiconductor layer extends to a second height above the substrate and the bottommost second semiconductor layer extends to the second height above the substrate.

15. A method comprising:
forming a first semiconductor layer over a first area and a second area of a substrate;
removing the first semiconductor layer from over the first area of the substrate;
forming a spacer feature on the substrate between the first and second areas of the substrate;
forming a first stack of semiconductor layers over the first area of the substrate and a second stack of semiconductor layers over the first semiconductor layer disposed over the second area of the substrate, wherein the first stack of the semiconductor layer and the second stack of semiconductor layers interface with the spacer feature after the forming of the first stack of semiconductor layers over the first area of the substrate and the second stack of semiconductor layers over the first semiconductor layer disposed over the second area of the substrate;
removing the spacer feature;
patterning the first stack of semiconductor layers; and
patterning the second stack of semiconductor layers.

16. The method of claim 15, wherein the forming of the first stack of semiconductor layers over the first area of the substrate and the second stack of semiconductor layers over the first semiconductor layer disposed over the second area of the substrate includes alternately forming second semiconductor layers and third semiconductor layers over the first and second areas of the substrate.

17. The method of claim 16, wherein the second semiconductor layers include a second semiconductor material and the third semiconductor layers include the first semiconductor material, the second semiconductor material being different from the first semiconductor material.

18. The method of claim 15, wherein the first area of the substrate is exposed after the removing of the first semiconductor layer from over the first area of the substrate.

19. The method of claim 15, further comprising forming a buffer layer over the first stack of semiconductor layers, the second stack of semiconductor layers and the spacer feature prior to patterning the first stack of semiconductor layers and patterning the second stack of semiconductor layers.

20. The method of claim 19, further comprising removing the buffer layer to expose a top surface of the spacer feature prior to the removing of the spacer feature.

* * * * *